(12) United States Patent
Lee et al.

(10) Patent No.: US 12,317,552 B2
(45) Date of Patent: May 27, 2025

(54) SEMICONDUCTOR DEVICE STRUCTURE AND METHOD FOR FORMING THE SAME

(71) Applicant: Taiwan Semiconductor Manufacturing Company, Ltd., Hsinchu (TW)

(72) Inventors: Chien-Wei Lee, Kaohsiung (TW); Yen-Ting Chen, Taichung (TW); Wei-Yang Lee, Taipei (TW); Chia-Pin Lin, Xinpu Township, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 556 days.

(21) Appl. No.: 17/579,833

(22) Filed: Jan. 20, 2022

(65) Prior Publication Data
US 2023/0231014 A1 Jul. 20, 2023

(51) Int. Cl.
*H10D 62/10* (2025.01)
*H10D 30/67* (2025.01)
*H10D 84/01* (2025.01)
*H10D 84/03* (2025.01)

(52) U.S. Cl.
CPC ....... *H10D 62/118* (2025.01); *H10D 30/6713* (2025.01); *H10D 30/6735* (2025.01); *H10D 30/6757* (2025.01); *H10D 62/115* (2025.01); *H10D 84/0128* (2025.01); *H10D 84/013* (2025.01); *H10D 84/0151* (2025.01); *H10D 84/038* (2025.01)

(58) Field of Classification Search
CPC ......... H01L 29/0665; H01L 21/823412; H01L 21/823418; H01L 21/823481; H01L 29/0649; H01L 29/42392; H01L 29/78618; H01L 29/78696; H01L 27/088; H01L 21/823425; H01L 29/0673; H01L 29/0847; H01L 29/1079; H01L 29/66439; H01L 29/7848; H01L 29/66545; H01L 29/775; H01L 29/165; B82Y 10/00
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| 9,412,817 B2 | 8/2016 | Yang et al. |

(Continued)

*Primary Examiner* — Suberr L Chi
*Assistant Examiner* — William C. Trice, III
(74) *Attorney, Agent, or Firm* — Birch, Stewart, Kolasch & Birch, LLP

(57) ABSTRACT

A semiconductor device structure is provided. The semiconductor device structure includes a substrate having a base and a fin structure over the base. The semiconductor device structure includes an isolation structure over the base and surrounding a lower portion of the fin structure. The semiconductor device structure includes a gate stack wrapped around an upper portion of the fin structure. The semiconductor device structure includes a source/drain structure partially embedded in the isolation structure and the lower portion of the fin structure. The source/drain structure has an undoped semiconductor layer and a first doped layer over the undoped semiconductor layer, and the undoped semiconductor layer separates the first doped layer from the isolation structure.

20 Claims, 24 Drawing Sheets

(56) References Cited

U.S. PATENT DOCUMENTS

| | | |
|---|---|---|
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 2021/0193829 A1* | 6/2021 | Reznicek ............ H01L 29/0847 |
| 2021/0408285 A1* | 12/2021 | Hickey ............ H01L 29/66545 |
| 2022/0052046 A1* | 2/2022 | Choi ................ H01L 21/02579 |
| 2022/0069078 A1* | 3/2022 | Yu .................... H01L 29/78696 |
| 2022/0416041 A1* | 12/2022 | Hasan ................ H10D 30/6735 |

* cited by examiner

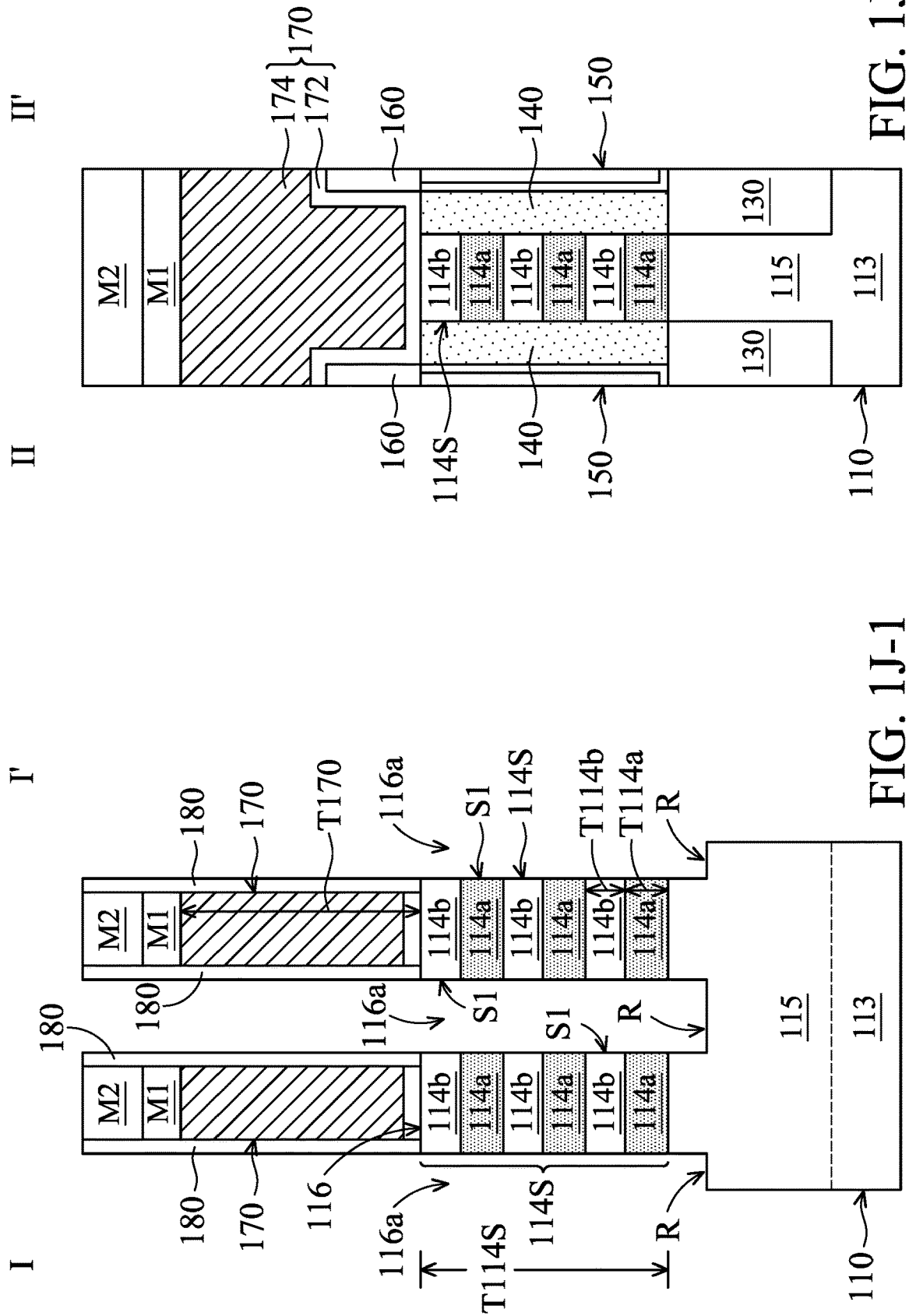

SEMICONDUCTOR DEVICE STRUCTURE AND METHOD FOR FORMING THE SAME

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. Such scaling down has also increased the complexity of processing and manufacturing ICs and, for these advances to be realized, similar developments in IC processing and manufacturing are needed.

One development in the scaling down process is the use of fin-type field effect transistors (FinFETs). It is desired to further improve the operation of FinFETs, such as by using a gate all around (GAA) transistor structure to increase the efficiency of gate control over the transistor channel.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIG. 1J-2 is a cross-sectional view illustrating the semiconductor device structure along a sectional line II-II' in FIG. 1J, in accordance with some embodiments.

FIG. 1P-1 is a cross-sectional view illustrating the semiconductor device structure along a sectional line 1P-1-1P-1' in FIG. 1P, in accordance with some embodiments.

FIGS. 2A-1 to 2D-1 are cross-sectional views of various stages of a process for forming a semiconductor device structure, in accordance with some embodiments.

FIGS. 2A-2 to 2D-2 are cross-sectional views of various stages of a process for forming a semiconductor device structure, in accordance with some embodiments.

DETAILED DESCRIPTION

Figure 1B:
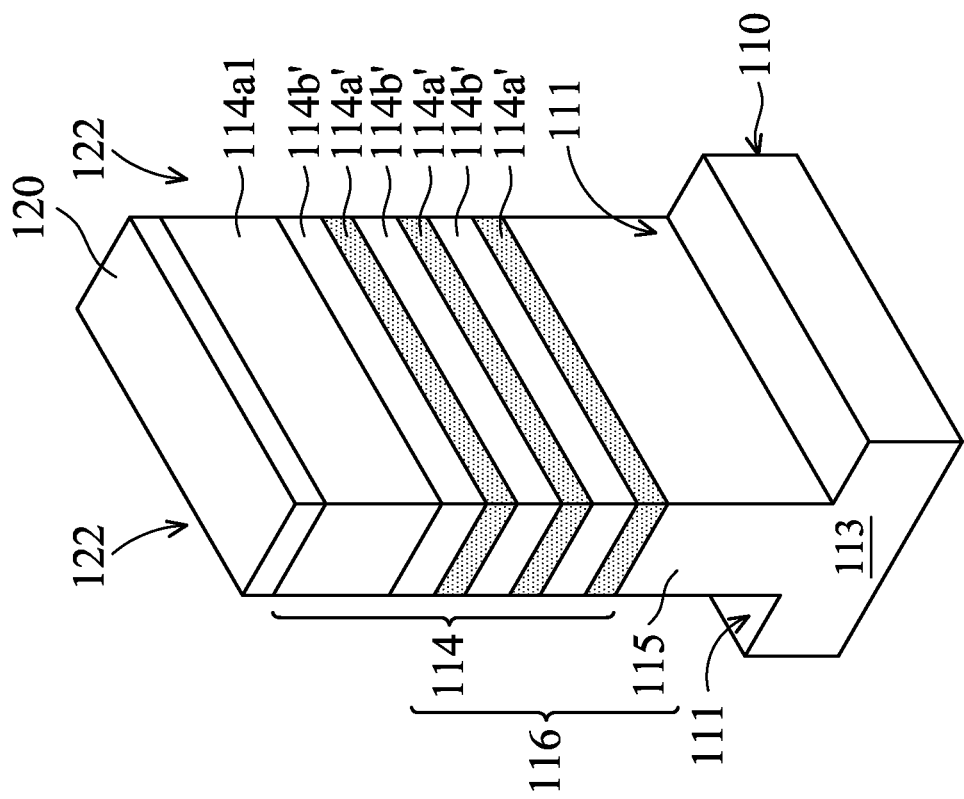
FIGS. 1A-1P are perspective views of various stages of a process for forming a semiconductor device structure, in accordance with some embodiments.
FIG. 1J-1 is a cross-sectional view illustrating the semiconductor device structure along a sectional line I-I' in FIG. 1J, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. The term "substantially" may be varied in different technologies and be in the deviation range understood by the skilled in the art. For example, the term "substantially" may also relate to 90% of what is specified or higher, such as 95% of what is specified or higher, especially 99% of what is specified or higher, including 100% of what is specified, though the present invention is not limited thereto. Furthermore, terms such as "substantially parallel" or "substantially perpendicular" may be interpreted as not to exclude insignificant deviation from the specified arrangement and may include for example deviations of up to 10°. The word "substantially" does not exclude "completely" e.g. a composition which is "substantially free" from Y may be completely free from Y.

The term "about" may be varied in different technologies and be in the deviation range understood by the skilled in the art. The term "about" in conjunction with a specific distance or size is to be interpreted so as not to exclude insignificant deviation from the specified distance or size. For example, the term "about" may include deviations of up to 10% of what is specified, though the present invention is not limited thereto. The term "about" in relation to a numerical value x may mean x ±5 or 10% of what is specified, though the present invention is not limited thereto.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Figure 1A:
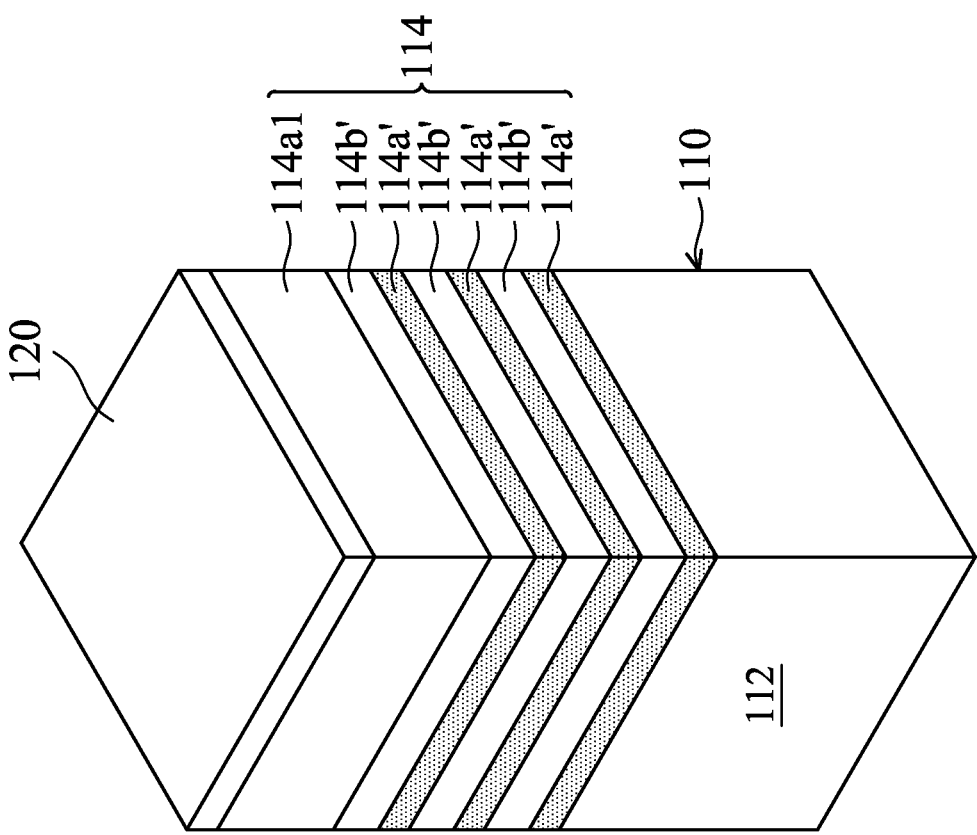
Figure 1D:
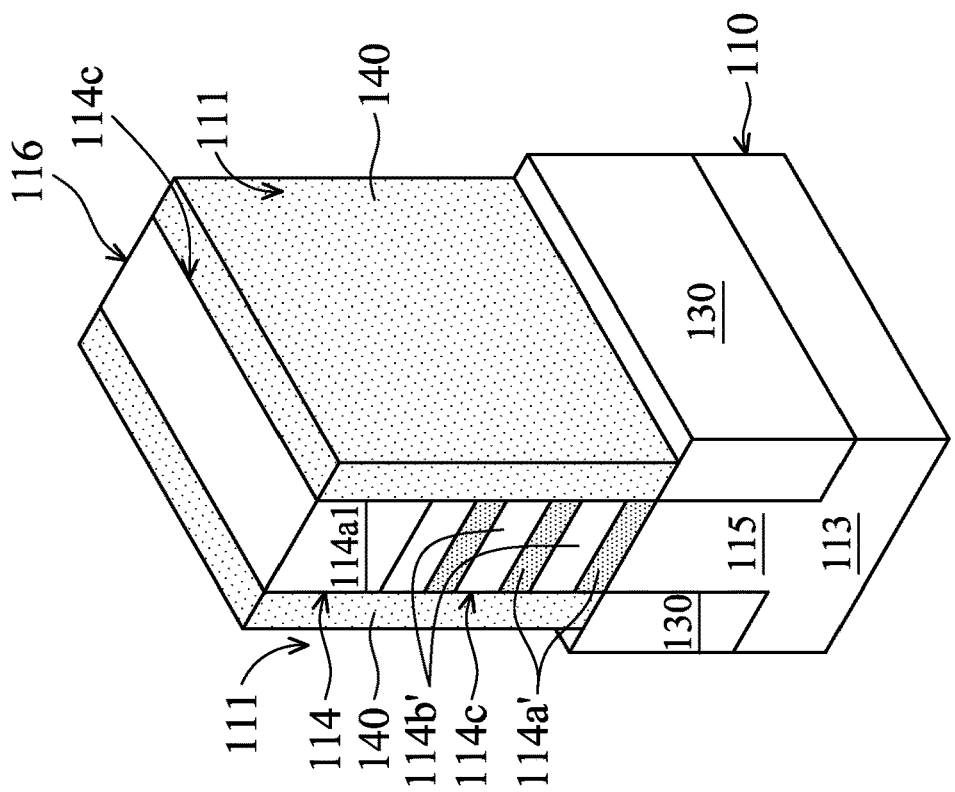
Figure 1C:
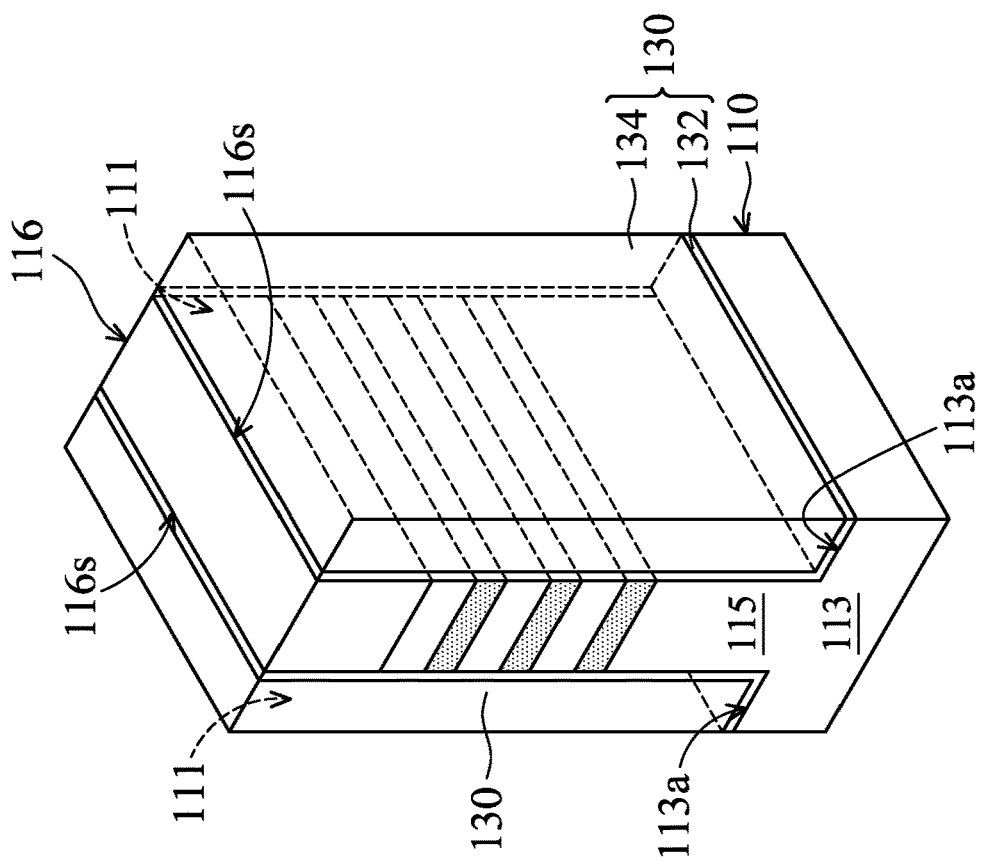
Figure 1E:
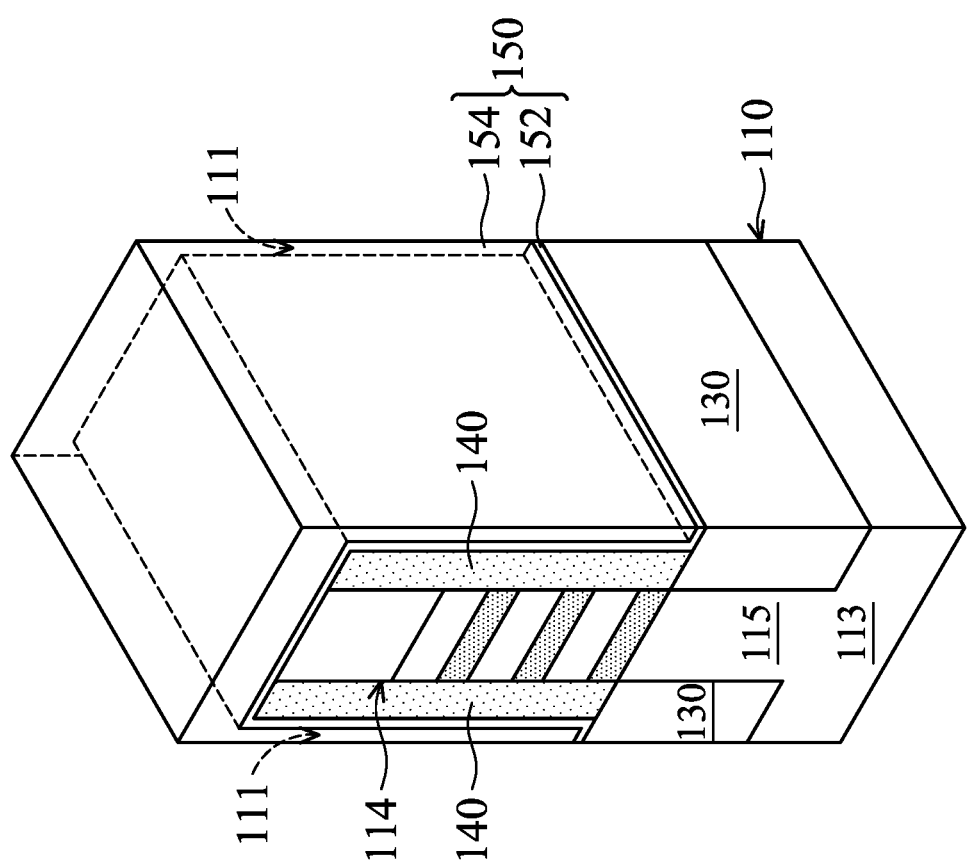
Figure 1F:
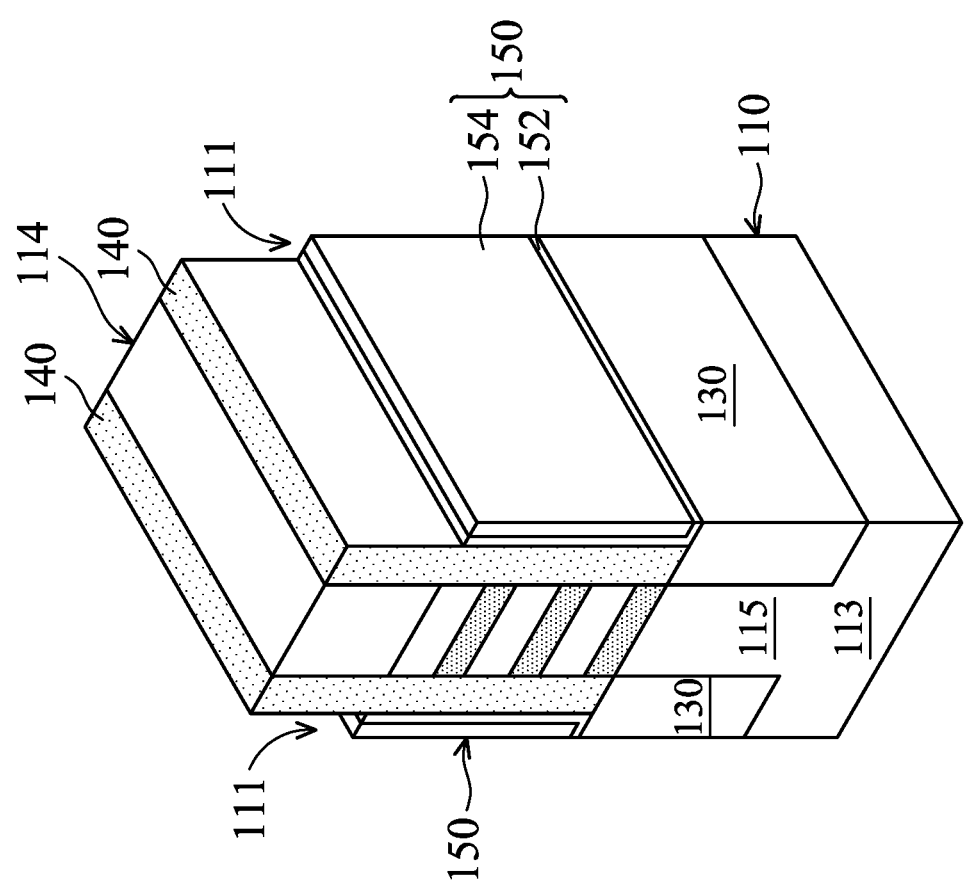
Figure 1G:
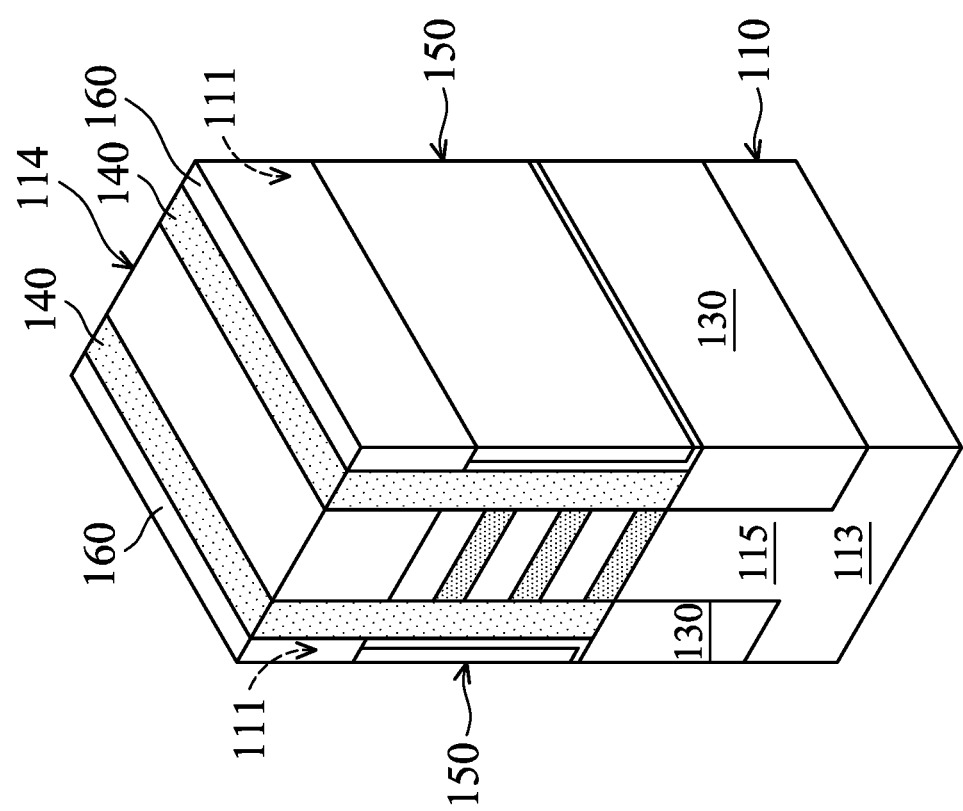
Figure 1H:
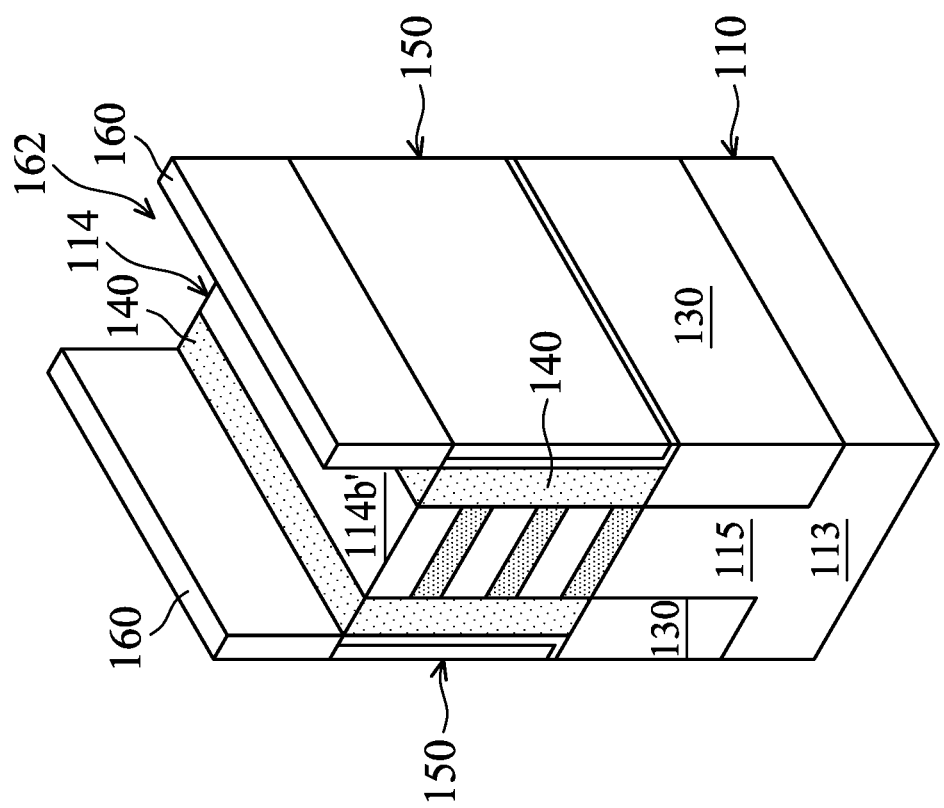
Figure 1I:
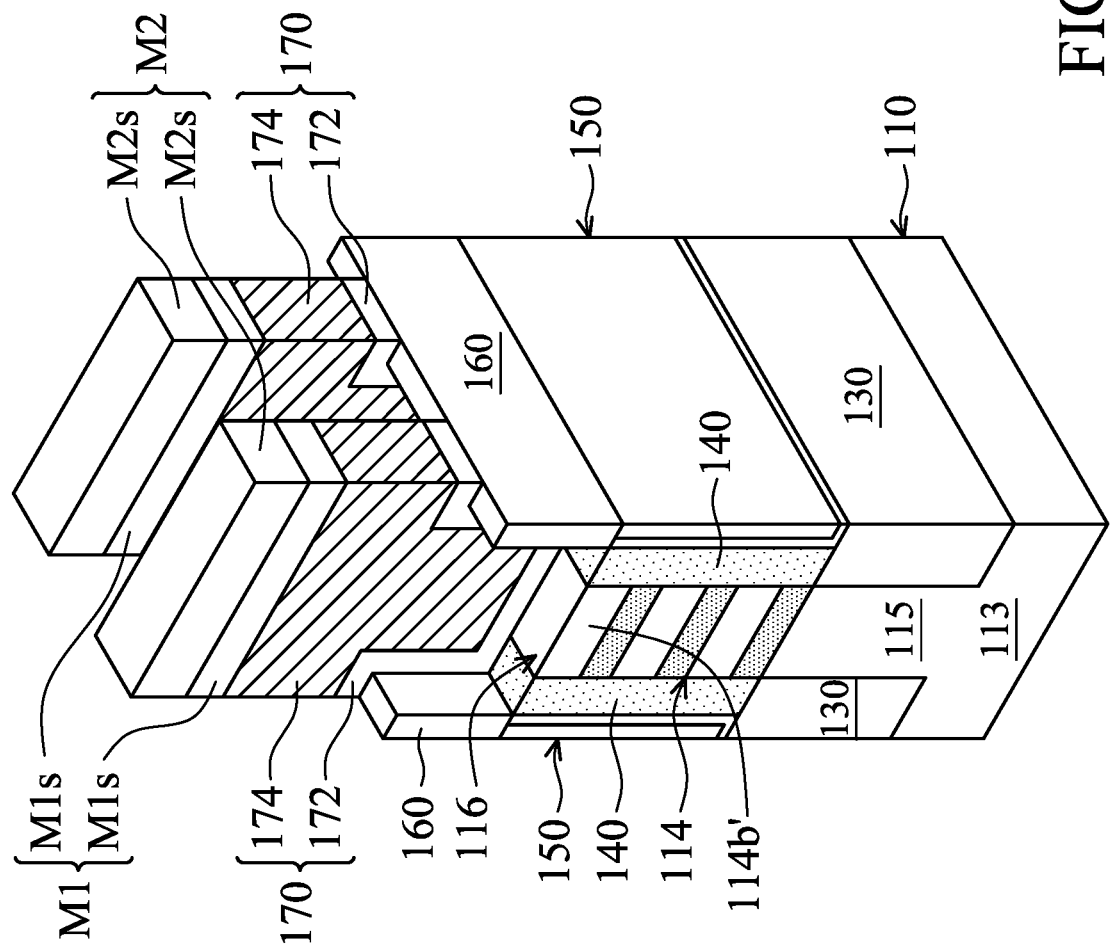
Figure 1J:
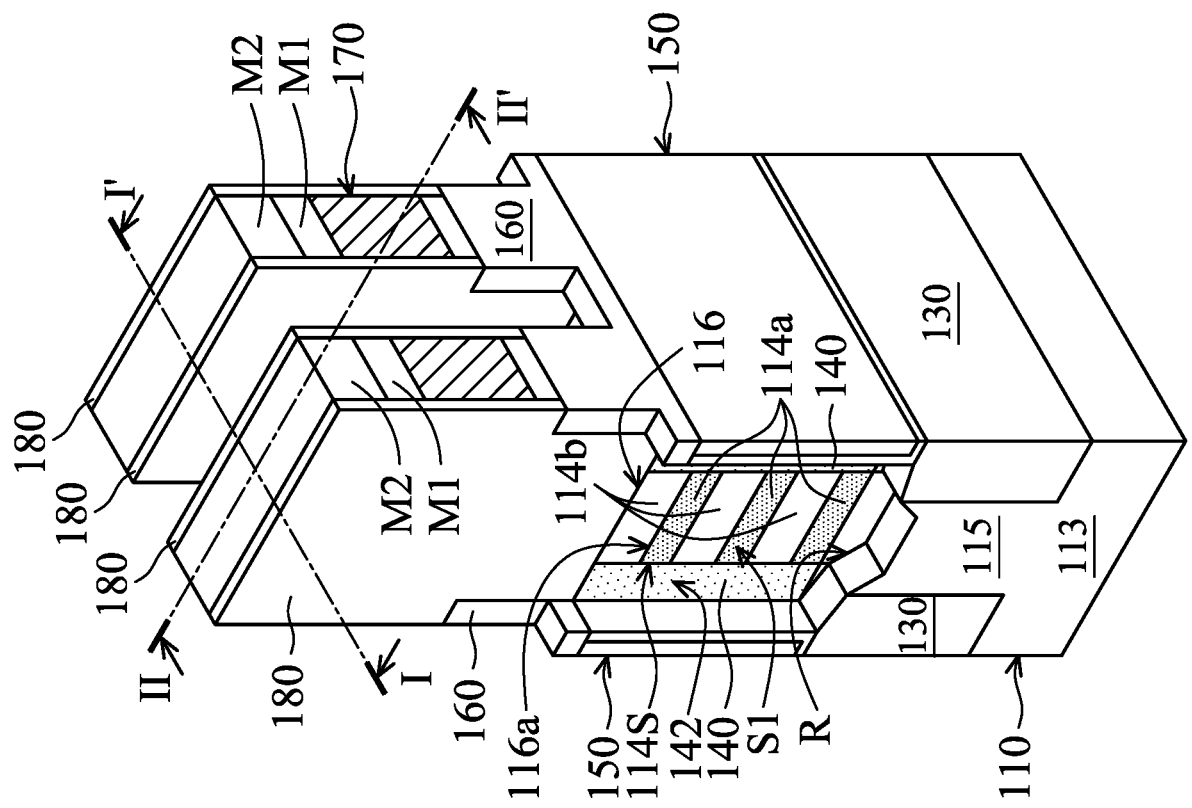
Figure 1K:
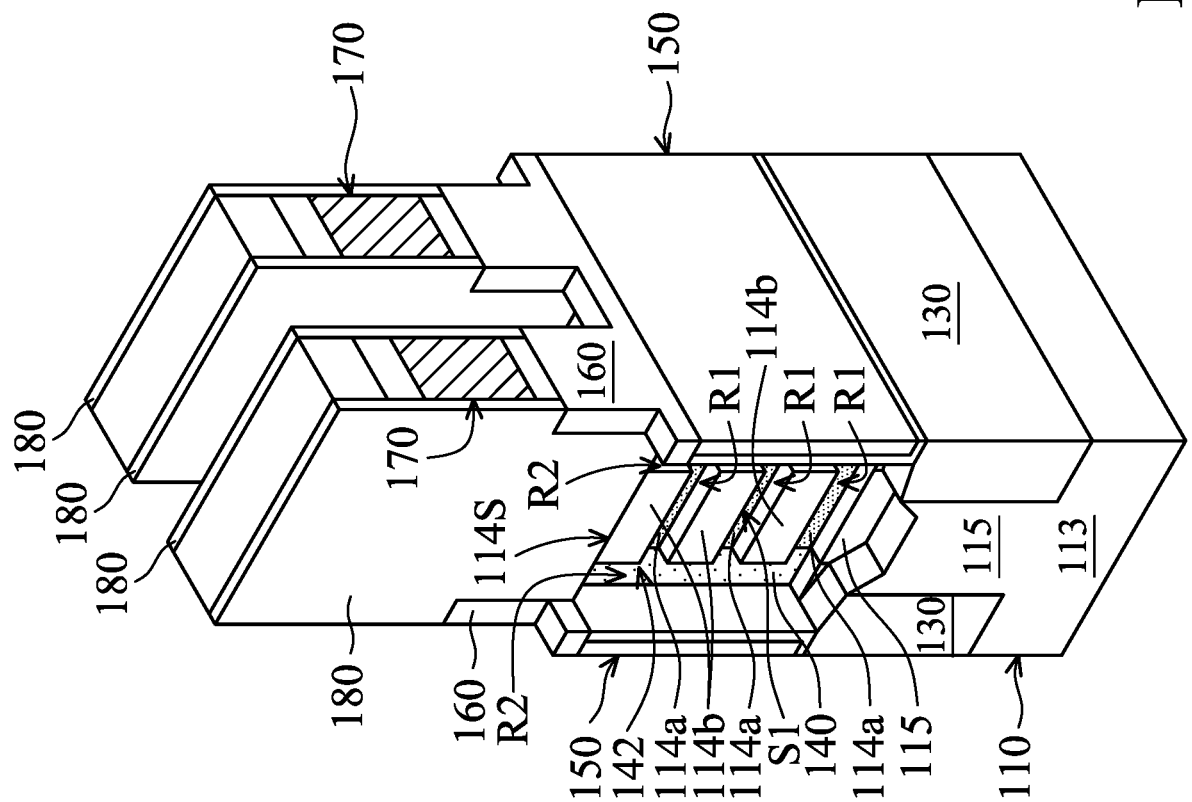
Figure 1L:
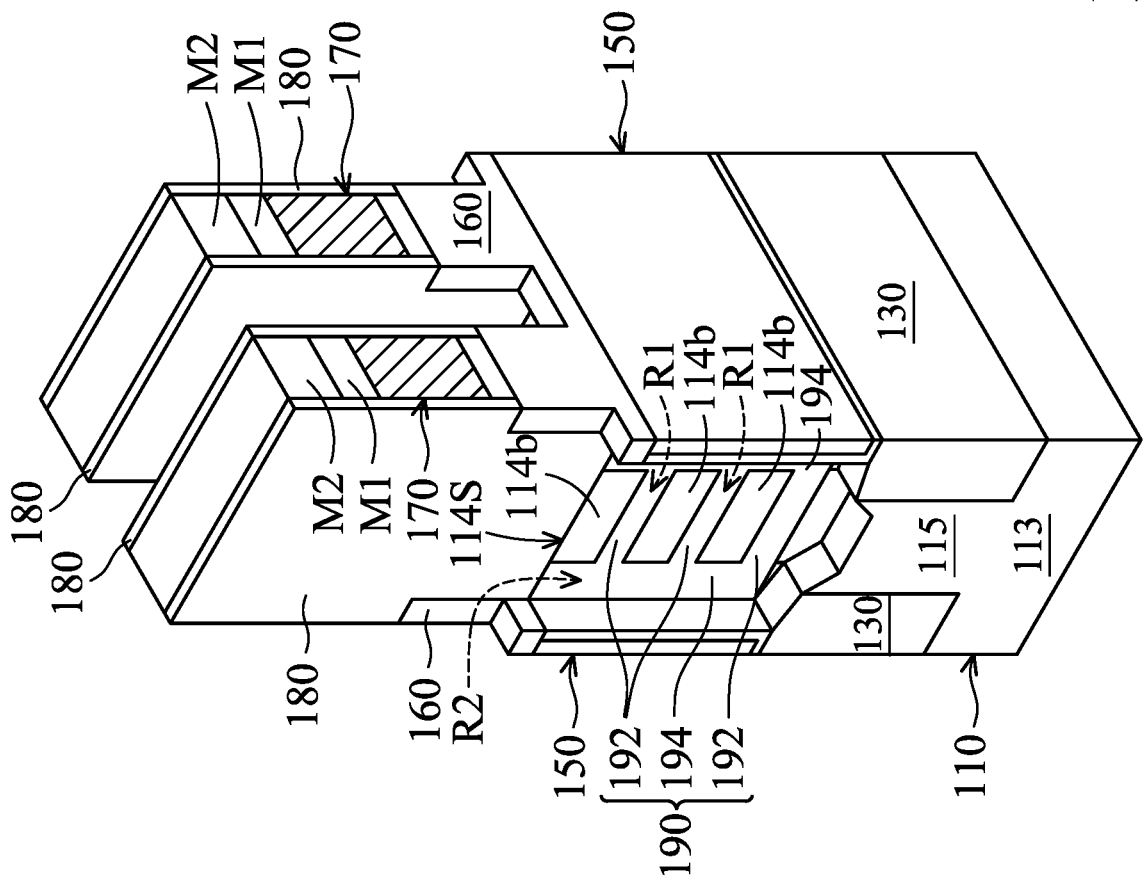
Figure 1M:
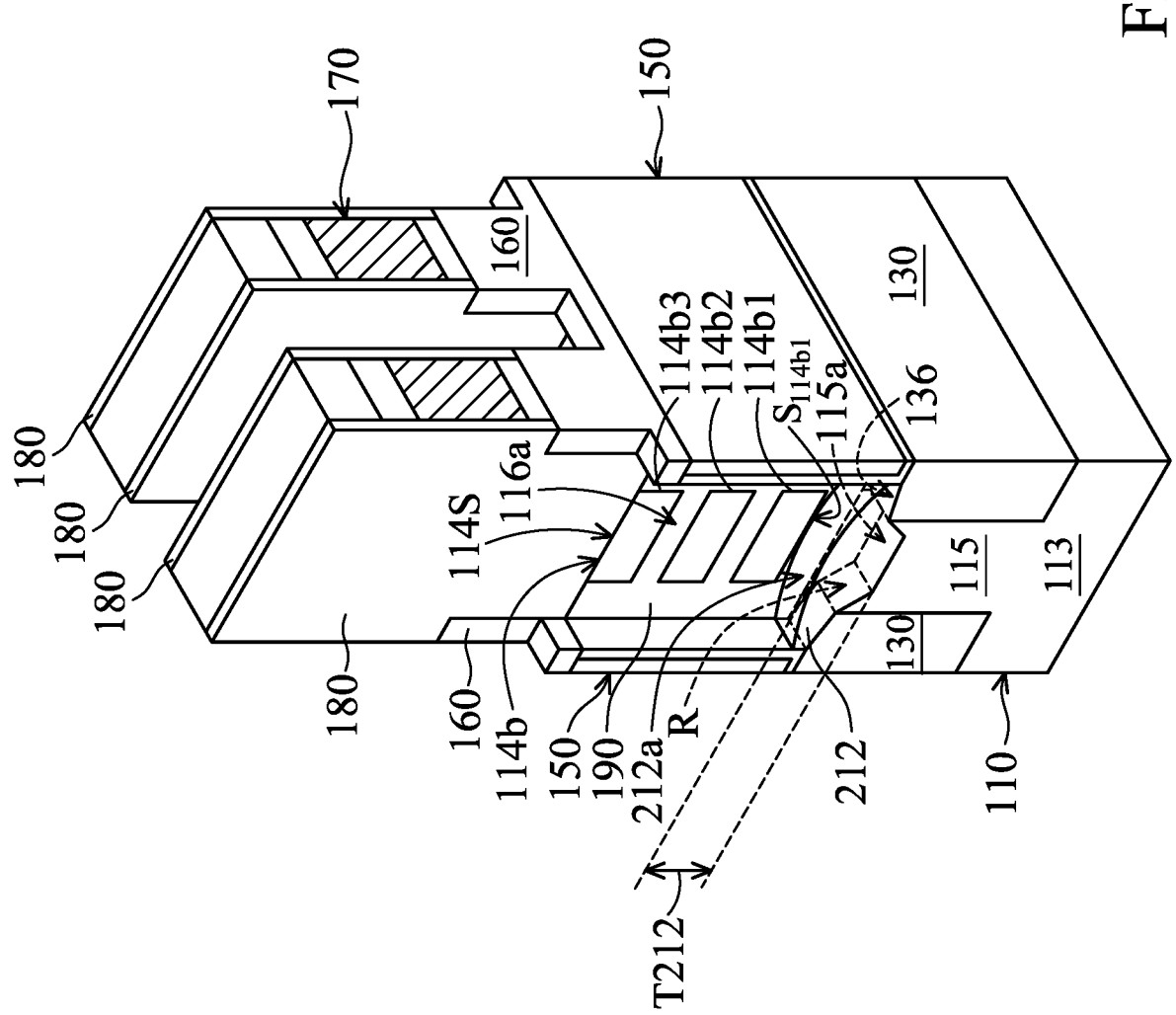
Figure 1N:
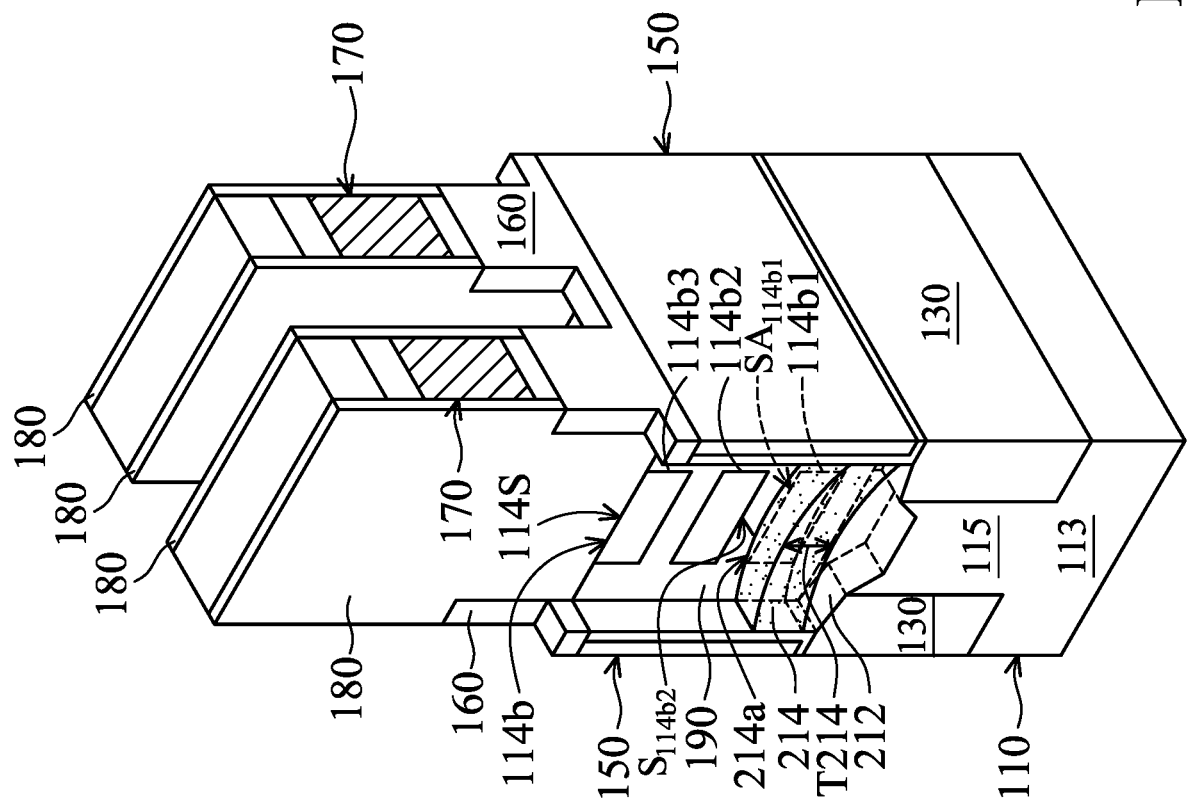
Figure 10:
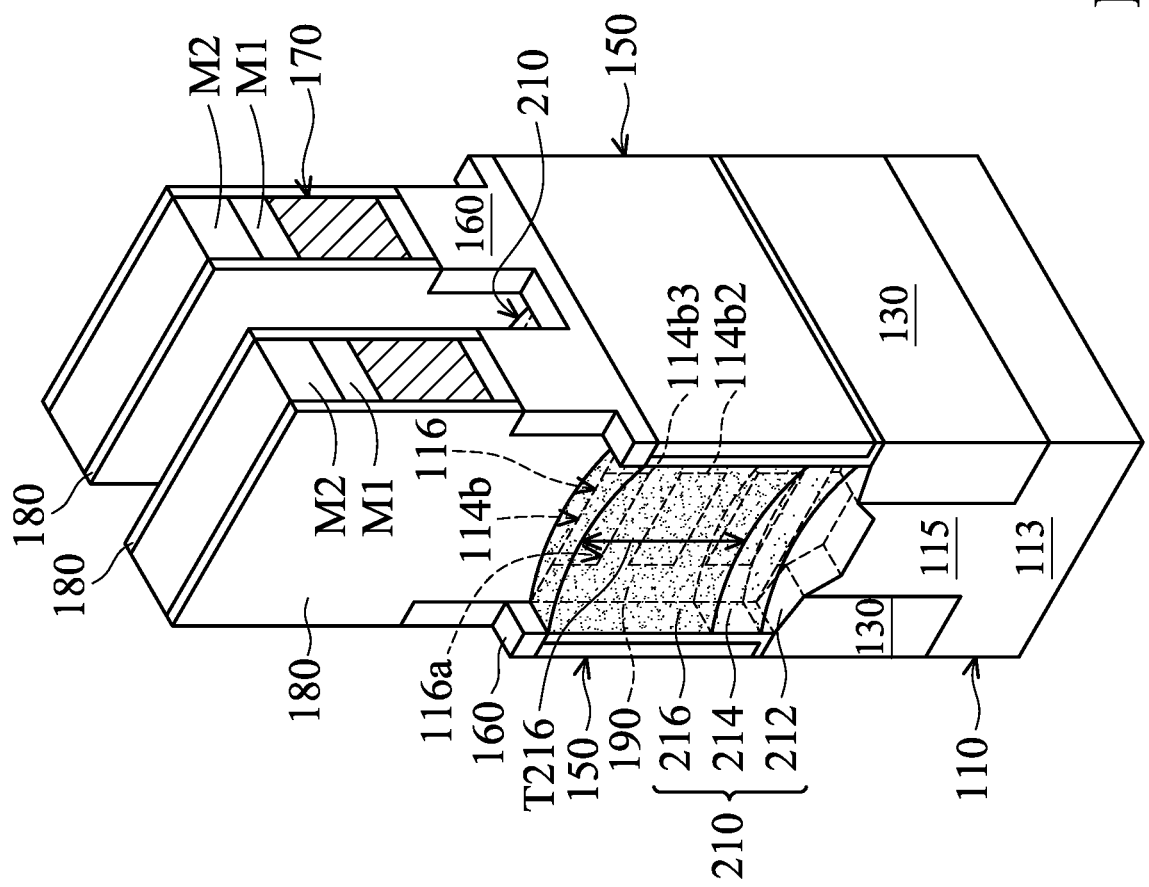
Figure 1P:
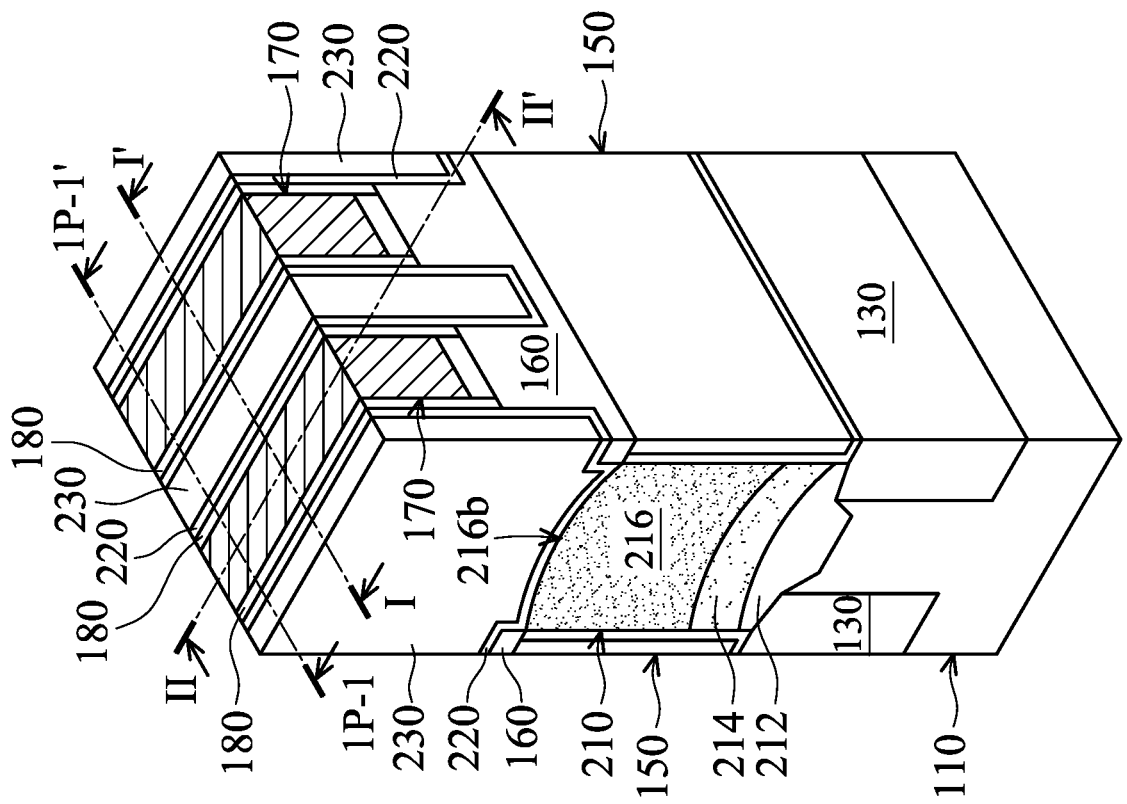

FIGS. 1A-1P are perspective views of various stages of a process for forming a semiconductor device structure, in accordance with some embodiments. As shown in FIG. 1A, a substrate 110 is provided, in accordance with some embodiments. The substrate 110 includes a lower portion 112 and a multilayer structure 114, in accordance with some embodiments. The multilayer structure 114 is formed over the lower portion 112, in accordance with some embodiments.

The lower portion 112 includes, for example, a semiconductor substrate. The semiconductor substrate includes, for example, a semiconductor wafer (such as a silicon wafer) or a portion of a semiconductor wafer. In some embodiments, the lower portion 112 is made of an elementary semiconductor material including silicon or germanium in a single crystal, polycrystal, or amorphous structure.

In some other embodiments, the lower portion 112 is made of a compound semiconductor, such as silicon carbide, gallium arsenide, gallium phosphide, indium phosphide, indium arsenide, an alloy semiconductor, such as SiGe, or GaAsP, or a combination thereof. The lower portion 112 may also include multi-layer semiconductors, semiconductor on insulator (SOI) (such as silicon on insulator or germanium on insulator), or a combination thereof.

In some embodiments, the lower portion 112 is a device wafer that includes various device elements. In some embodiments, the various device elements are formed in and/or over the lower portion 112. The device elements are not shown in figures for the purpose of simplicity and clarity.

Examples of the various device elements include active devices, passive devices, other suitable elements, or a combination thereof. The active devices may include transistors or diodes (not shown). The passive devices include resistors, capacitors, or other suitable passive devices.

For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc.

Various processes, such as front-end-of-line (FEOL) semiconductor fabrication processes, are performed to form the various device elements. The FEOL semiconductor fabrication processes may include deposition, etching, implantation, photolithography, annealing, planarization, one or more other applicable processes, or a combination thereof.

In some embodiments, isolation features (not shown) are formed in the lower portion 112. The isolation features are used to define active regions and electrically isolate various device elements formed in and/or over the lower portion 112 in the active regions. In some embodiments, the isolation features include shallow trench isolation (STI) features, local oxidation of silicon (LOCOS) features, other suitable isolation features, or a combination thereof.

The multilayer structure 114 is also referred to a super lattice structure or a super lattice epitaxial growth structure, in accordance with some embodiments. The multilayer structure 114 includes sacrificial layers 114a', a thick sacrificial layer 114a1, and channel layers 114b', in accordance with some embodiments. The thick sacrificial layer 114a1 is over the sacrificial layers 114a' and the channel layers 114b', in accordance with some embodiments.

The thick sacrificial layer 114a1 is thicker than the sacrificial layer 114a', in accordance with some embodiments. The thick sacrificial layer 114a1 is thicker than the channel layer 114b', in accordance with some embodiments. The thick sacrificial layer 114a1 and the sacrificial layer 114a' are used to reserve a space for a metal gate stack formed in the subsequent process, in accordance with some embodiments.

The sacrificial layers 114a' and the channel layers 114b' are alternately arranged as illustrated in FIG. 1A, in accordance with some embodiments. It should be noted that, for the sake of simplicity, FIG. 1A shows three layers of the sacrificial layers 114a' and three layers of the channel layers 114b' for illustration, but does not limit the invention thereto. In some embodiments, the number of the sacrificial layers 114a' or the channel layers 114b' is between 2 and 10.

The sacrificial layers 114a' and the thick sacrificial layer 114a1 are made of a same first material, such as a first semiconductor material, in accordance with some embodiments. The channel layers 114b' are made of a second material, such as a second semiconductor material, in accordance with some embodiments.

The first material is different from the second material, in accordance with some embodiments. The first material has an etch selectivity with respect to the second material, in accordance with some embodiments. In some embodiments, the sacrificial layers 114a' and the thick sacrificial layer 114a1 are made of SiGe, and the channel layers 114b' are made of Si. The atomic percentage of Ge in the sacrificial layers 114a' or the thick sacrificial layer 114a1 ranges from about 5% to 40%, in accordance with some embodiments.

In some other embodiments, the sacrificial layers 114a' or the channel layers 114b' are made of other materials such as germanium, a compound semiconductor such as silicon carbide, gallium arsenide, gallium phosphide, indium phosphide, indium arsenide, and/or indium antimonide, an alloy semiconductor such as GaAsP, AlInAs, AlGaAs, InGaAs, GaInP, and/or GaInAsP, or combinations thereof.

The channel layers 114b' and the lower portion 112 are made of the same material such as Si, in accordance with some embodiments. The material of the sacrificial layers 114a' and the thick sacrificial layer 114a1 is different from the material of the lower portion 112, in accordance with some embodiments. In some other embodiments, the sacrificial layers 114a', the thick sacrificial layer 114a1, the channel layers 114b', and the lower portion 112 are made of different materials, in accordance with some embodiments.

The sacrificial layers 114a', the thick sacrificial layer 114a1, and the channel layers 114b' are formed using an epitaxial growth process such as a molecular beam epitaxy (MBE) process, a metal-organic chemical vapor deposition (MOCVD) process, and/or another suitable epitaxial growth process. The epitaxial growth process is performed under about 350° C. to about 950° C. temperature and about 5 Torr to about 25 Torr pressure for about 10 seconds to about 40 seconds, in accordance with some embodiments.

As shown in FIG. 1A, a mask layer 120 is formed over the multilayer structure 114, in accordance with some embodiments. The mask layer 120 is made of an oxide material such as silicon dioxide ($SiO_2$), a nitride material such as silicon nitride ($Si_3N_4$), or another suitable material, which is different from the materials of the substrate 110 (or the multilayer structure 114), in accordance with some embodiments. The mask layer 120 is formed using a deposition process (e.g., a physical vapor deposition process or a chemical vapor deposition process), in accordance with some embodiments.

As shown in FIG. 1B, portions of the mask layer 120 are removed to form trenches 122 in the mask layer 120, in accordance with some embodiments. The trenches 122 pass through the mask layer 120, in accordance with some embodiments. The removal process includes a photolithography process and an etching process (e.g., a dry etching process), in accordance with some embodiments.

As shown in FIG. 1B, portions of the substrate 110 exposed by the trenches 122 are removed through the trenches 122, in accordance with some embodiments. The removal process forms trenches 111 in the substrate 110, in accordance with some embodiments.

After the removal process, the remaining portion of the substrate 110 includes a base 113 and a fin structure 116, in accordance with some embodiments. The fin structure 116 is over the base 113, in accordance with some embodiments. The base 113 is formed from the lower portion 112 (as shown in FIG. 1A), in accordance with some embodiments.

The fin structure 116 includes a lower portion 115 and a portion of the multilayer structure 114, in accordance with some embodiments. The portion of the multilayer structure 114 includes portions of the sacrificial layers 114a', the thick sacrificial layer 114a1, and the channel layers 114b', in accordance with some embodiments. The lower portion 115 is formed from the lower portion 112 (as shown in FIG. 1A), in accordance with some embodiments.

As shown in FIG. 1C, the mask layer 120 is removed, in accordance with some embodiments. As shown in FIG. 1C, a liner layer 132 is conformally formed over sidewalls 116s of the fin structure 116 and a top surface 113a of the base 113, in accordance with some embodiments.

As shown in FIG. 1C, a dielectric layer 134 is formed over the liner layer 132 and in the trenches 111, in accordance with some embodiments. The liner layer 132 and the dielectric layer 134 together form an isolation structure 130, in accordance with some embodiments. The isolation structure 130 surrounds the fin structure 116, in accordance with some embodiments.

The liner layer 132 is made of oxides (e.g., silicon oxide), nitrides (e.g., silicon nitride), or another suitable dielectric material, in accordance with some embodiments. The dielectric layer 134 is made of oxide (such as silicon oxide), fluorosilicate glass (FSG), a low-k dielectric material, and/or another suitable dielectric material. In some embodiments, the liner layer 132 and the dielectric layer 134 are made of different materials.

The removal of the mask layer 120 and the formation of the liner layer 132 and the dielectric layer 134 include: conformally depositing a liner material layer (not shown) over the substrate 110; depositing a dielectric material layer (not shown) over the liner material layer; and performing a planarization process to remove the liner material layer and the dielectric material layer outside of the trenches 111 and the mask layer 120, in accordance with some embodiments.

The liner material layer may be deposited by an atomic layer deposition (ALD) process, a chemical vapor deposition (CVD) process, or another applicable process. The dielectric material layer may be deposited by a chemical vapor deposition process, an atomic layer deposition process, a physical vapor deposition (PVD) process, or another applicable process.

For the sake of simplicity, FIG. 1D omits depicting the boundary between the liner layer 132 and the dielectric layer 134 and only shows the isolation structure 130, in accordance with some embodiments. As shown in FIG. 1D, an upper portion of the isolation structure 130 is removed to expose sidewalls 114c of the multilayer structure 114, in accordance with some embodiments. The removal process includes an etching process such as a dry etching process or a wet etching process, in accordance with some embodiments.

As shown in FIG. 1D, a cladding layer 140 is formed over the sidewalls 114c of the multilayer structure 114, in accordance with some embodiments. The cladding layer 140 is used to reserve a space for a metal gate stack formed in the subsequent process, in accordance with some embodiments.

The sacrificial layers 114a', the thick sacrificial layer 114a1, and the cladding layer 140 are made of the same first material, in accordance with some embodiments. The channel layers 114b' are made of a second material, in accordance with some embodiments. The first material is different from the second material, in accordance with some embodiments.

The cladding layer 140 is made of a semiconductor material such as SiGe, Si, and/or germanium, a compound semiconductor such as silicon carbide, gallium arsenide, gallium phosphide, indium phosphide, indium arsenide, and/or indium antimonide, an alloy semiconductor such as GaAsP, AlInAs, AlGaAs, InGaAs, GaInP, and/or GaInAsP, or combinations thereof, in accordance with some embodiments.

The cladding layer 140 is formed using an epitaxial growth process such as a molecular beam epitaxy (MBE) process, a metal-organic chemical vapor deposition (MOCVD) process, and/or another suitable epitaxial growth process.

As shown in FIG. 1E, a liner layer 152 is conformally formed over the isolation structure 130, the cladding layer 140, and the multilayer structure 114, in accordance with some embodiments. As shown in FIG. 1E, a dielectric layer 154 is formed over the liner layer 152 and in the trenches 111, in accordance with some embodiments. The liner layer 152 and the dielectric layer 154 together form an isolation structure 150, in accordance with some embodiments.

The liner layer 152 is made of oxides (e.g., silicon oxide), nitrides (e.g., silicon nitride), or another suitable dielectric material, in accordance with some embodiments. The dielectric layer 154 is made of oxide (such as silicon oxide), fluorosilicate glass (FSG), a low-k dielectric material, and/or another suitable dielectric material. In some embodiments, the liner layer 152 and the dielectric layer 154 are made of different materials.

The liner layer 152 may be deposited by an atomic layer deposition (ALD) process, a chemical vapor deposition (CVD) process, or another applicable process. The dielectric layer 154 may be deposited by a chemical vapor deposition process, an atomic layer deposition process, a physical vapor deposition (PVD) process, or another applicable process.

As shown in FIG. 1F, an upper portion of the isolation structure 150 is removed, in accordance with some embodiments. The removal process includes an etching process such as a dry etching process or a wet etching process, in accordance with some embodiments.

As shown in FIG. 1G, dielectric fins 160 are formed over the isolation structure 150 and in the trenches 111, in accordance with some embodiments. The formation of the dielectric fins 160 includes forming a dielectric layer over the isolation structure 150, the cladding layer 140, and the multilayer structure 114 and in the trenches 111; and removing portions of the dielectric layer outside of the trenches 111, in accordance with some embodiments. The dielectric layer remaining in the trenches 111 forms the dielectric fins 160, in accordance with some embodiments.

The dielectric layer is formed using a deposition process such as a physical vapor deposition process, a chemical vapor deposition process, an atomic layer deposition process, or the like, in accordance with some embodiments. The removal process of the portions of the dielectric layer outside of the trenches 111 includes a planarization process such as a chemical mechanical polishing process, in accordance with some embodiments.

The dielectric fins 160 are made of a dielectric material, such as a high dielectric constant (high-k) material, in accordance with some embodiments. The term "high-k material" means a material having a dielectric constant greater than the dielectric constant of silicon dioxide, in accordance with some embodiments.

The high-k material includes metal oxides, such as hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), aluminum oxide, hafnium dioxide-alumina ($HfO_2$—$Al_2O_3$) alloy, other suitable high-k dielectric materials, or combinations thereof, in accordance with some embodiments.

In some other embodiments, the high-k material includes metal nitrides, metal silicates, transition metal-oxides, transition metal-nitrides, transition metal-silicates, oxynitrides of metals, other suitable materials, or combinations thereof.

As shown in FIG. 1H, the thick sacrificial layer 114a1 and upper portions of the cladding layer 140 are removed, in accordance with some embodiments. After the removal process, a trench 162 is formed between the dielectric fins 160, in accordance with some embodiments.

The trench 162 exposes the multilayer structure 114 and the cladding layer 140 thereunder, in accordance with some embodiments. The removal process includes an etching process such as a wet etching process or a dry etching process, in accordance with some embodiments.

As shown in FIG. 1I, gate stacks 170 are formed over the dielectric fins 160, the multilayer structure 114, and the cladding layer 140, in accordance with some embodiments. As shown in FIG. 1I, mask layers M1 and M2 are formed over the gate stacks 170, in accordance with some embodiments. The mask layer M1 is between the mask layer M2 and the gate stacks 170, in accordance with some embodiments.

Each gate stack 170 includes a gate dielectric layer 172 and a gate electrode 174, in accordance with some embodiments. The gate electrode 174 is over the gate dielectric layer 172, in accordance with some embodiments. The mask layer M1 has strip portions M1s, in accordance with some embodiments.

The mask layer M2 has strip portions M2s, in accordance with some embodiments. One of the strip portions M1s covers one of the gate stacks 170, in accordance with some embodiments. One of the strip portions M2s covers the corresponding one of the strip portions M1s, in accordance with some embodiments.

The formation of the gate stacks 170 includes conformally forming a gate dielectric material layer (not shown) over the dielectric fins 160, the multilayer structure 114, and the cladding layer 140; forming a gate electrode layer (not shown) over the gate dielectric material layer; forming a first mask material layer (not shown) over the gate electrode layer; forming a second mask material layer (not shown) over the first mask material layer; patterning the first mask material layer and the second mask material layer by a photolithography process and an etching process to form the mask layers M1 and M2, which expose portions of the gate electrode layer; and removing the portions of the gate electrode layer and the gate dielectric material layer exposed by the mask layers M1 and M2, in accordance with some embodiments.

After the removal process, the remaining gate electrode layer forms the gate electrode 174 of each gate stack 170, and the remaining gate dielectric material layer forms the gate dielectric layer 172 of each gate stack 170, in accordance with some embodiments.

The gate dielectric material layer or the gate dielectric layer 172 is made of an insulating material, such as oxide (e.g., silicon oxide), in accordance with some embodiments. The gate dielectric material layer is formed by a deposition process, such as a chemical vapor deposition (CVD) process, a low-pressure chemical vapor deposition (LPCVD) process, a plasma enhanced chemical vapor deposition (PECVD) process, a high-density plasma chemical vapor deposition (HDPCVD) process, a physical vapor deposition (PVD) process, or another applicable process.

The gate electrode layer or the gate electrode 174 is made of a semiconductor material (e.g. polysilicon) or a conductive material (e.g., metal or alloy), in accordance with some embodiments. The gate electrode layer is formed by a deposition process, such as a physical vapor deposition (PVD) process, a chemical vapor deposition (CVD) process, or another applicable process, in accordance with some embodiments.

In some embodiments, the mask layer M1 serves a buffer layer or an adhesion layer that is formed between the underlying gate electrode 174 and the overlying mask layer M2. The mask layer M1 may also be used as an etch stop layer when the mask layer M2 is removed or etched.

In some embodiments, the mask layer M1 is made of an oxide-containing insulating material (e.g., silicon oxide), a nitride-containing insulating material (e.g., silicon nitride, silicon carbide, silicon oxynitride, silicon oxycarbonitride, or silicon carbonitride), or a metal oxide material (e.g., aluminum oxide).

In some embodiments, the mask layer M2 is made of an oxide-containing insulating material (e.g., silicon oxide), a nitride-containing insulating material (e.g., silicon nitride, silicon oxynitride, silicon oxycarbonitride, or silicon carbonitride), silicon carbide, or a metal oxide material (e.g., aluminum oxide). The mask layers M1 and M2 are made of different materials, in accordance with some embodiments.

In some embodiments, the first mask material layer is formed by a deposition process, such as a chemical vapor deposition (CVD) process, a low-pressure chemical vapor deposition (LPCVD) process, a plasma enhanced chemical vapor deposition (PECVD) process, or a high-density plasma chemical vapor deposition (HDPCVD) process, a spin-on process, or another applicable process.

In some embodiments, the second mask material layer is formed by a deposition process, such as a chemical vapor deposition (CVD) process, a low-pressure chemical vapor deposition (LPCVD) process, a plasma enhanced chemical vapor deposition (PECVD) process, or a high-density plasma chemical vapor deposition (HDPCVD) process, a spin-on process, or another applicable process.

In some embodiments, the removal process of the portions of the gate electrode layer and the gate dielectric material layer exposed by the mask layers M1 and M2 includes an etching process, such as an anisotropic etching process (e.g., a dry etching process), in accordance with some embodiments.

Figures 1, 1P:
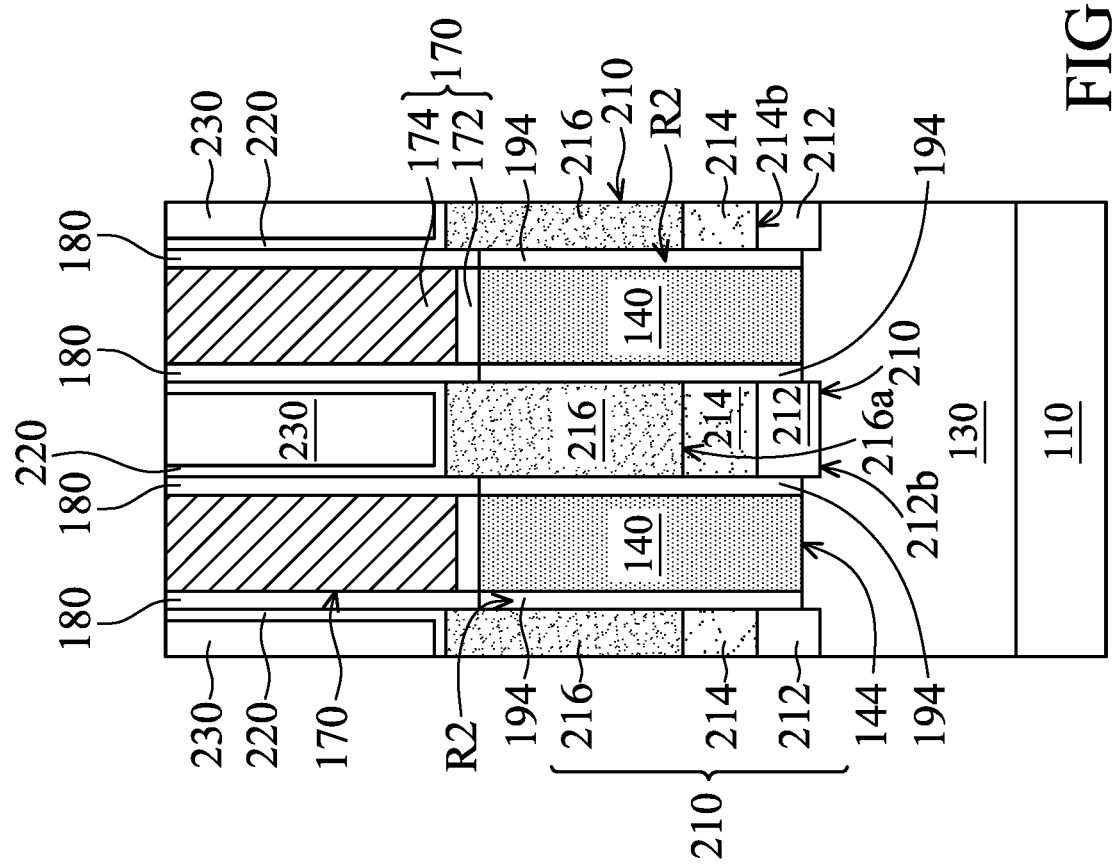
Figures 2, 2A:
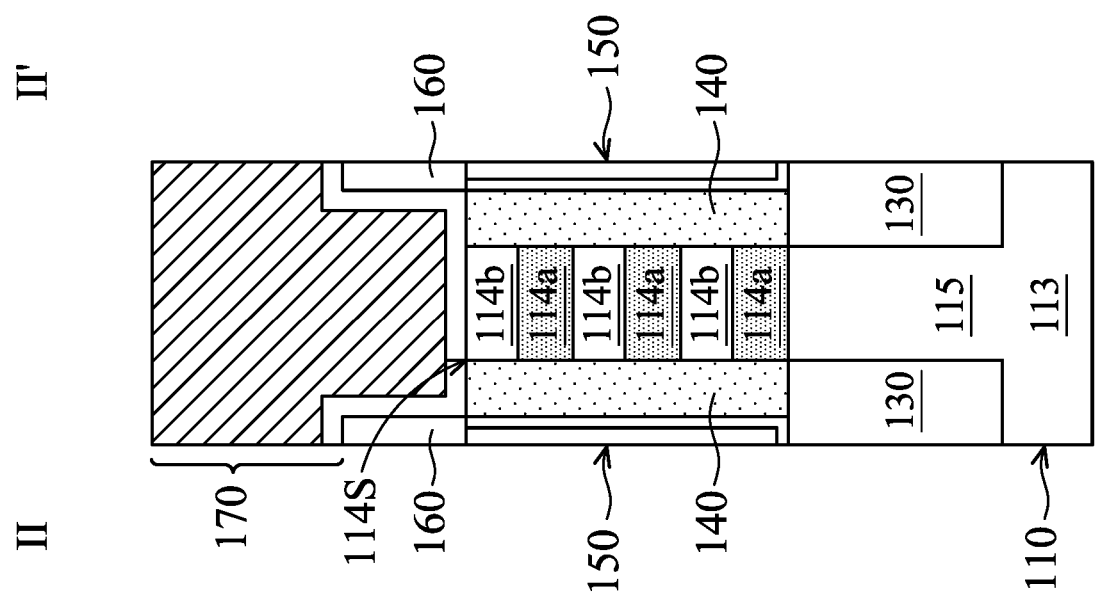
Figures 1, 2A:
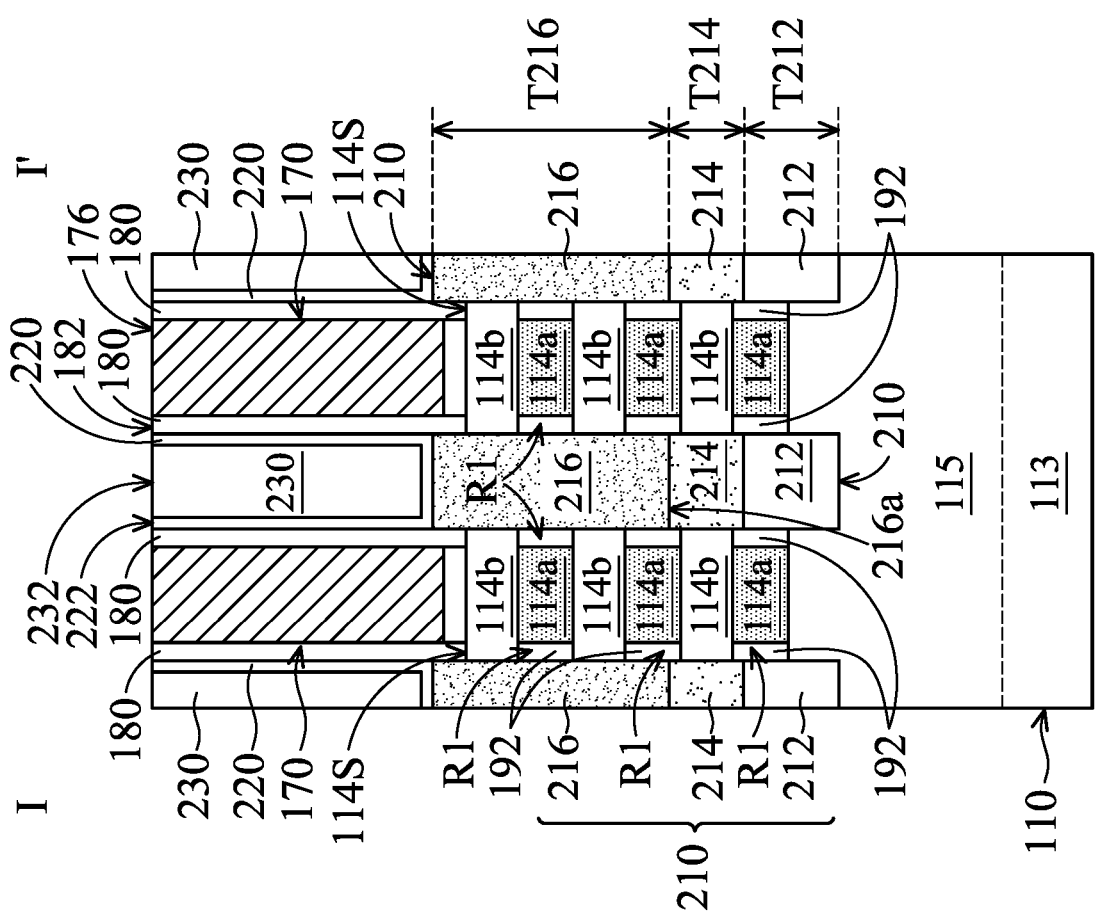

FIG. 1J-1 is a cross-sectional view illustrating the semiconductor device structure along a sectional line I-I' in FIG. 1J, in accordance with some embodiments. FIG. 1J-2 is a cross-sectional view illustrating the semiconductor device structure along a sectional line II-II' in FIG. 1J, in accordance with some embodiments.

As shown in FIGS. 1J, 1J-1, and 1J-2, a spacer 180 is formed over sidewalls of the gate stacks 170 and the mask layers M1 and M2, in accordance with some embodiments. In some embodiments, the spacer 180 is a single-layered structure. In some embodiments, the spacer 180 is a multi-layered structure.

The spacer 180 is made of an oxide-containing insulating material, such as silicon oxide. In some other embodiments, the spacer 180 is made of a nitride-containing insulating material, such as silicon nitride (SiN), silicon oxynitride (SiON), silicon oxycarbonitride (SiOCN), or silicon carbonitride (SiCN).

The formation of the spacer 180 includes forming a spacer layer (not shown) over the fin structure 116, the cladding layer 140, the dielectric fins 160, and the mask layers M1 and M2; and removing portions of the spacer layer, in accordance with some embodiments.

The spacer layer is formed using a deposition process, such as a chemical vapor deposition (CVD) process, an atomic layer deposition (ALD) process, or a physical vapor deposition (PVD) process, in accordance with some embodiments. The removal process includes an etching process, such as an anisotropic etching process (e.g., a dry etching process), in accordance with some embodiments.

As shown in FIGS. 1J, 1J-1, and 1J-2, the fin structure 116, the dielectric fins 160, and the cladding layer 140, which are not covered by the gate stacks 170 and the spacer 180, are partially removed, in accordance with some embodiments. After the removal process, the cladding layer 140 remains under the gate stacks 170 and the spacer 180, in accordance with some embodiments.

The removal process partially removes the multilayer structure 114 and the lower portion 115, which are not covered by the gate stacks 170 and the spacer 180, in accordance with some embodiments. The removal process further partially removes the isolation structure 130, which is not covered by the gate stacks 170 and the spacer 180, in accordance with some embodiments. Therefore, the removal process forms recesses R in the lower portion 115 of the fin structure 116 and the isolation structure 130, which are not covered by the gate stacks 170 and the spacer 180, in accordance with some embodiments.

The removal process forms recesses 116a in the fin structure 116, in accordance with some embodiments. The multilayer structure 114 is divided into multilayer stacks 114S by the recesses 116a, in accordance with some embodiments.

In each multilayer stack 114S, the remaining sacrificial layers 114a' form sacrificial nanostructures 114a, and the remaining channel layers 114b' form channel nanostructures 114b, in accordance with some embodiments. Each multilayer stack 114S includes three sacrificial nanostructures 114a and three channel nanostructures 114b, in accordance with some embodiments.

The sacrificial nanostructures 114a and the channel nanostructures 114b include nanowires and/or nanosheets, in accordance with some embodiments. The thickness T114a of the sacrificial nanostructure 114a ranges from about 1 nm to about 15 nm, in accordance with some embodiments. The thickness T114b of the channel nanostructure 114b ranges from about 1 nm to about 15 nm, in accordance with some embodiments.

In some embodiments, the thickness T114a is substantially equal to the thickness T114b. In some embodiments, the thickness T114a is less than the thickness T114b. In some embodiments, the thickness T114a is greater than the thickness T114b. The removal process for forming the recesses 116a includes an etching process, such as an anisotropic etching process (e.g., a dry etching process), in accordance with some embodiments.

As shown in FIG. 1J-1, the thickness T170 of the gate stack 170 ranges from about 80 nm to about 140 nm, in accordance with some embodiments. The thickness T170 ranges from about 100 nm to about 120 nm, in accordance with some embodiments. The thickness T114S of the multilayer stack 114S ranges from about 40 nm to about 110 nm, in accordance with some embodiments. The thickness T114S of the multilayer stack 114S ranges from about 60 nm to about 90 nm, in accordance with some embodiments.

As shown in FIGS. 1J and 1K, portions of the sacrificial nanostructures 114a and the cladding layer 140 are removed from sidewalls Si of the sacrificial nanostructures 114a and sidewalls 142 of the cladding layer 140, in accordance with some embodiments.

Therefore, the removal process forms recesses R1 in the multilayer stacks 114S, in accordance with some embodiments. Each recess R1 is surrounded by the corresponding sacrificial nanostructure 114a and the corresponding channel nanostructures 114b, in accordance with some embodiments.

As shown in FIG. 1K, the removal process forms recesses R2, in accordance with some embodiments. Each recess R2 is surrounded by the cladding layer 140, the corresponding gate stack 170, the corresponding multilayer stack 114S, and the isolation structure 150, in accordance with some embodiments. The recesses R2 are on opposite sides of the multilayer stack 114S, in accordance with some embodiments.

The removal process includes etching processes, such as dry etching processes and wet etching processes, in accordance with some embodiments. In some embodiments, the removal process includes a first dry etching process, a first wet etching process, a second dry etching process, and a second wet etching process, which are performed sequentially.

The first dry etching process includes a plasma etching process, in accordance with some embodiments. The first dry etching process uses He gas of about 300 sccm to about 2200 sccm, Ar gas of about 80 sccm to about 1100 sccm, and NF$_3$ gas of about 5 sccm to about 200 sccm under about 0° C. to about 30° C. temperature and about 0.5 Torr to about 15 Torr pressure for about 30 seconds to about 80 seconds, in accordance with some embodiments.

The first wet etching process uses a dilute hydrofluoric acid (HF) solution, in accordance with some embodiments. The volume percentage concentration of the dilute hydrofluoric acid solution ranges from about 0.5% to about 2%, in accordance with some embodiments.

The second dry etching process uses He gas of about 300 sccm to about 2200 sccm, Ar gas of about 80 sccm to about 1100 sccm, and NF$_3$ gas of about 5 sccm to about 200 sccm under about 0° C. to about 30° C. temperature and about 0.5 Torr to about 15 Torr pressure for about 10 seconds to about 50 seconds, in accordance with some embodiments.

The second wet etching process uses a dilute hydrofluoric acid solution, in accordance with some embodiments. The volume percentage concentration of the dilute hydrofluoric acid solution ranges from about 0.5% to about 2%, in accordance with some embodiments.

As shown in FIG. 1L, an inner spacer structure 190 is formed in the recesses R1 and R2, in accordance with some embodiments. The inner spacer structure 190 is a continuous structure, in accordance with some embodiments. The inner spacer structure 190 is wrapped around the corresponding multilayer stack 114S, in accordance with some embodiments.

The inner spacer structure 190 includes inner spacers 192 and 194, in accordance with some embodiments. The inner spacers 192 are in the recesses R1 of the multilayer stacks 114S, in accordance with some embodiments. The inner spacers 194 are in the recesses R2, which are surrounded by the cladding layer 140, the corresponding gate stack 170, the corresponding multilayer stack 114S, and the isolation structure 150, in accordance with some embodiments.

In some embodiments, the inner spacer structure 190 is made of an oxide-containing insulating material, such as silicon oxide, or a nitride-containing insulating material, such as silicon nitride (SiN), silicon oxynitride (SiON), silicon oxycarbonitride (SiOCN), or silicon carbonitride (SiCN), in accordance with some embodiments.

The formation of the inner spacer structure 190 includes forming an inner spacer material layer over the spacer 180, the mask layer M2, the dielectric fins 160, the isolation structure 130, and the substrate 110 and in the recesses R1 and R2; and removing portions of the inner spacer material layer outside of the recesses R1 and R2, in accordance with some embodiments. The remaining inner spacer material layer forms the inner spacer structure 190, in accordance with some embodiments.

The inner spacer material layer is formed using a deposition process such as an atomic layer deposition (ALD) process, a chemical vapor deposition (CVD) process, or another applicable process. The removal process of the portions of the inner spacer material layer outside of the recesses R1 and R2 includes an etching process, such as a dry etching process or a wet etching process, in accordance with some embodiments.

As shown in FIG. 1M, an undoped semiconductor layer 212 is formed in the recesses R, in accordance with some embodiments. The undoped semiconductor layer 212 is used to provide a top surface 212a without residues coming from the removal process of FIG. 1J, in accordance with some embodiments. The (clean) top surface 212a is conducive to form epitaxial structures thereon, in accordance with some embodiments.

The recesses R are filled up with the undoped semiconductor layer 212, in accordance with some embodiments. The undoped semiconductor layer 212 is partially embedded in the isolation structure 130 and the lower portion 115 of the fin structure 116, in accordance with some embodiments.

In some embodiments, the entire top surface 212a of the undoped semiconductor layer 212 is over a top surface 136 of the isolation structure 130. The undoped semiconductor layer 212 has a thickness T212 ranges from about 10 nm to about 30 nm, in accordance with some embodiments. The thickness T212 ranges from about 20 nm to about 30 nm, in accordance with some embodiments.

As shown in FIG. 1M, the nanostructures 114b include nanostructures 114b1, 114b2, and 114b3, in accordance with some embodiments. The undoped semiconductor layer 212 has a trapezoidal shape, in accordance with some embodiments. The top surface 212a of the undoped semiconductor layer 212 is a curved surface, such as a convex curved surface, in accordance with some embodiments. The top surface 212a of the undoped semiconductor layer 212 is a (100) surface, in accordance with some embodiments.

The undoped semiconductor layer 212 is made of an elementary semiconductor material including silicon or another suitable material in a single crystal, polycrystal, or amorphous structure, in accordance with some embodiments.

The undoped semiconductor layer 212 is formed using an epitaxial process and an etching process, in accordance with some embodiments. Specifically, the epitaxial process and the etching process are performed simultaneously, in accordance with some embodiments.

The etching process is performed to remove the epitaxial structure formed over the sidewalls of the nanostructures 114b1, 114b2, and 114b3, in accordance with some embodiments. The etching process is performed using an etching gas including an HCl gas, in accordance with some embodiments. In the etching process, the flow rate of the HCl gas ranges from about 80 sccm to 130 sccm, in accordance with some embodiments.

The sidewalls of the nanostructures 114b1, 114b2, and 114b3 are (110) surfaces, in accordance with some embodiments. The upper surface 115a of the lower portion 115 of the fin structure 116 is a (100) surface, in accordance with some embodiments. The undoped semiconductor layer 212 grows from the upper surface 115a of the lower portion 115 and therefore has the top surface 212a, which is a (100) surface, in accordance with some embodiments.

The epitaxial process is performed at high temperature and at low pressure to improve the growth rate of the undoped semiconductor layer 212 with the (100) surface so as to fill the recesses R up with the undoped semiconductor layer 212, in accordance with some embodiments. The process temperature of the epitaxial process ranges from about 700° C. to about 900° C., in accordance with some embodiments. The process temperature of the epitaxial process ranges from about 700° C. to about 800° C., in accordance with some embodiments.

The process pressure of the epitaxial process ranges from about 5 torr to about 30 torr, in accordance with some embodiments. The process pressure of the epitaxial process ranges from about 5 torr to about 25 torr, in accordance with some embodiments. The process pressure of the epitaxial process ranges from about 5 torr to about 20 torr, in accordance with some embodiments.

If the undoped semiconductor layer 212 is in direct contact with the inner spacer structure 190, the growth rate of the undoped semiconductor layer 212 with the (100)

surface is decreased, in accordance with some embodiments. Therefore, the top surface 212a of the undoped semiconductor layer 212 is lower than a bottom surface $S_{114b1}$ of the nanostructure 114b1, in accordance with some embodiments.

As shown in FIG. 1N, a doped layer 214 is formed over the undoped semiconductor layer 212, in accordance with some embodiments. The undoped semiconductor layer 212 separates the doped layer 214 from the lower portion 115 of the fin structure 116 and the isolation structure 130, which prevents the dopants in the doped layer 214 from diffusing into the isolation structure 130, in accordance with some embodiments. Therefore, the generation of the leakage current between source/drain structures formed subsequently is prevented, and the short circuit between the source/drain structures is prevented, in accordance with some embodiments. Therefore, the drain-induced barrier lowering (DIBL) issue is prevented, in accordance with some embodiments.

In some embodiments, a top surface 214a of the doped layer 214 is between a top surface $SA_{114b1}$ of the nanostructure 114b1 and a bottom surface $S_{114b2}$ of the nanostructure 114b2. The doped layer 214 is in direct contact with the nanostructure 114b1, in accordance with some embodiments. The top surface 214a of the doped layer 214 is a curved surface, such as a convex curved surface, in accordance with some embodiments.

The thickness T214 of the doped layer 214 ranges from about 2 nm to about 20 nm, in accordance with some embodiments. The thickness T214 of the doped layer 214 ranges from about 5 nm to about 15 nm, in accordance with some embodiments. The doped layer 214 is thinner than the undoped semiconductor layer 212, in accordance with some embodiments.

In some embodiments, the doped layer 214 is made of a semiconductor material (e.g., silicon germanium) with P-type dopants, such as the Group IIIA element, in accordance with some embodiments. The Group IIIA element includes boron or another suitable material.

In some other embodiments, the doped layer 214 is made of a semiconductor material (e.g., silicon) with N-type dopants, such as the Group VA element, in accordance with some embodiments. The Group VA element includes phosphor (P), antimony (Sb), or another suitable Group VA material.

The dopant concentration of the doped layer 214 ranges from about $1*10^{20}$ atom/cm$^3$ to about $5*10^{20}$ atom/cm$^3$, in accordance with some embodiments. The doped layer 214 is formed using an epitaxial process, in accordance with some embodiments.

As shown in FIG. 1O, a doped layer 216 is formed over the doped layer 214, in accordance with some embodiments. In one of the recesses 116a of the fin structure 116, the undoped semiconductor layer 212, the doped layer 214, and the doped layer 216 together form a source/drain structure 210, in accordance with some embodiments.

The undoped semiconductor layer 212 separates the doped layer 216 from the isolation structure 130 and the lower portion 115 of the fin structure 116, which prevents the dopants in the doped layer 216 from diffusing into the isolation structure 130, in accordance with some embodiments.

As a result, the generation of the leakage current between the source/drain structures 210 is prevented, and the short circuit between the source/drain structures 210 is prevented, in accordance with some embodiments. Therefore, the drain-induced barrier lowering (DIBL) issue is prevented, in accordance with some embodiments. The yield of the doped layer 216 is improved, in accordance with some embodiments. As a result, the reliability of the semiconductor device structure with the undoped semiconductor layer 212 is improved, in accordance with some embodiments.

Furthermore, the undoped semiconductor layer 212 is formed using a high temperature and low pressure process, in accordance with some embodiments. The cost of the high temperature and low pressure process is low, and the high temperature and low pressure process can be easily performed, in accordance with some embodiments.

The thickness T216 of the doped layer 216 ranges from about 40 nm to about 80 nm, in accordance with some embodiments. The thickness T216 of the doped layer 216 ranges from about 50 nm to about 70 nm, in accordance with some embodiments. The undoped semiconductor layer 212 is thinner than the doped layer 216, in accordance with some embodiments.

The dopant concentration of the doped layer 216 is greater than the dopant concentration of the doped layer 214, in accordance with some embodiments. In some embodiments, a conductivity of the doped layer 216 is greater than a conductivity of the doped layer 214. Therefore, the doped layer 216 can well control the channel nanostructures 114b, in accordance with some embodiments. The conductivity of the doped layer 214 is greater than a conductivity of the undoped semiconductor layer 212, in accordance with some embodiments.

In some embodiments, the doped layer 216 is made of a semiconductor material (e.g., silicon germanium) with P-type dopants, such as the Group IIIA element, in accordance with some embodiments. The Group IIIA element includes boron or another suitable material.

In some other embodiments, the doped layer 216 is made of a semiconductor material (e.g., silicon) with N-type dopants, such as the Group VA element, in accordance with some embodiments. The Group VA element includes phosphor (P), antimony (Sb), or another suitable Group VA material.

If the doped layer 216 is made of SiGe:B, the Ge concentration of the doped layer 216 ranges from about 40 atom % to about 60 atom %, in accordance with some embodiments. The B concentration of the doped layer 216 ranges from about $9*10^{20}$ atom/cm$^3$ to about $21*10^{21}$ atom/cm$^3$, in accordance with some embodiments. The doped layer 216 is formed using an epitaxial process, in accordance with some embodiments.

As shown in FIG. 1O, the undoped semiconductor layer 212 and the doped layers 214 and 216 have a substantially same width, in accordance with some embodiments. The source/drain structures 210 are formed over the lower portion 115 of the fin structure 116, in accordance with some embodiments. The source/drain structures 210 are connected to the sidewalls of the channel nanostructures 114b, in accordance with some embodiments. The source/drain structures 210 are also referred to as stressors, in accordance with some embodiments.

FIG. 1P-1 is a cross-sectional view illustrating the semiconductor device structure along a sectional line 1P-1-1P-1' in FIG. 1P, in accordance with some embodiments. FIG. 2A-1 is a cross-sectional view illustrating the semiconductor device structure along a sectional line I-I' in FIG. 1P, in accordance with some embodiments. FIG. 2A-2 is a cross-sectional view illustrating the semiconductor device structure along a sectional line II-II' in FIG. 1P, in accordance with some embodiments.

As shown in FIGS. 1P, 1P-1, and 2A-1, an etch stop layer 220 is formed over the source/drain structures 210, the dielectric fins 160, and sidewalls of the spacer 180, in accordance with some embodiments. The etch stop layer 220 conformally covers the source/drain structures 210, the dielectric fins 160, and the sidewalls of the spacer 180, in accordance with some embodiments.

The etch stop layer 220 is made of a dielectric material such as a nitride-containing material including silicon nitride (SiN), silicon oxynitride (SiON), or silicon carbonitride (SiCN), in accordance with some embodiments.

As shown in FIGS. 1P, 1P-1, and 2A-1, a dielectric layer 230 is formed over the etch stop layer 220, in accordance with some embodiments. The etch stop layer 220 is between the dielectric layer 230 and the source/drain structures 210 to separate the dielectric layer 230 from the source/drain structures 210, in accordance with some embodiments.

The dielectric layer 230 is made of an insulating material such as an oxide-containing material including silicon oxide, or a nitride-containing material including silicon nitride, silicon oxynitride, silicon oxycarbonitride, or silicon carbonitride, in accordance with some embodiments.

As shown in FIGS. 1P, 1P-1, 2A-1, and 2A-2, the mask layers M1 and M2 are removed, in accordance with some embodiments. As shown in FIG. 2A-1, after the removal process, top surfaces 222, 232, 182, and 176 of the etch stop layer 220, the dielectric layer 230, the spacer 180, and the gate stack 170 are substantially level with each other, in accordance with some embodiments. The removal process includes a planarization process such as a chemical mechanical polishing process, in accordance with some embodiments.

The formation of the etch stop layer 220 and the dielectric layer 230 and the removal process of the mask layers M1 and M2 include forming an etch stop material layer (not shown) over the source/drain structures 210, the spacer 180, and the mask layer M2; forming a dielectric material layer over the etch stop material layer; and removing top portions of the etch stop material layer, the dielectric material layer, the spacer 180, and the gate stack 170 and the mask layers M1 and M2, in accordance with some embodiments.

After the removal process, the remaining etch stop material layer forms the etch stop layer 220, and the remaining dielectric material layer forms the dielectric layer 230, in accordance with some embodiments. The etch stop material layer is formed using a deposition process, such as a chemical vapor deposition process or a physical vapor deposition process, in accordance with some embodiments. The dielectric material layer is formed using a deposition process, such as a chemical vapor deposition process or a physical vapor deposition process, in accordance with some embodiments.

As shown in FIG. 1P-1, a bottom surface 216a of the doped layer 216 is higher than a bottom surface 144 of the cladding layer 140, in accordance with some embodiments. As shown in FIG. 1P, the top surface 216b of the doped layer 216 is a curved surface, such as a convex curved surface, in accordance with some embodiments.

As shown in FIG. 1P-1, in some embodiments, a bottom surface 214b of the doped layer 214 is higher than the bottom surface 144 of the cladding layer 140. In some embodiments, a bottom surface 212b of the undoped semiconductor layer 212 is lower than the bottom surface 144 of the cladding layer 140.

Figures 2, 2B:
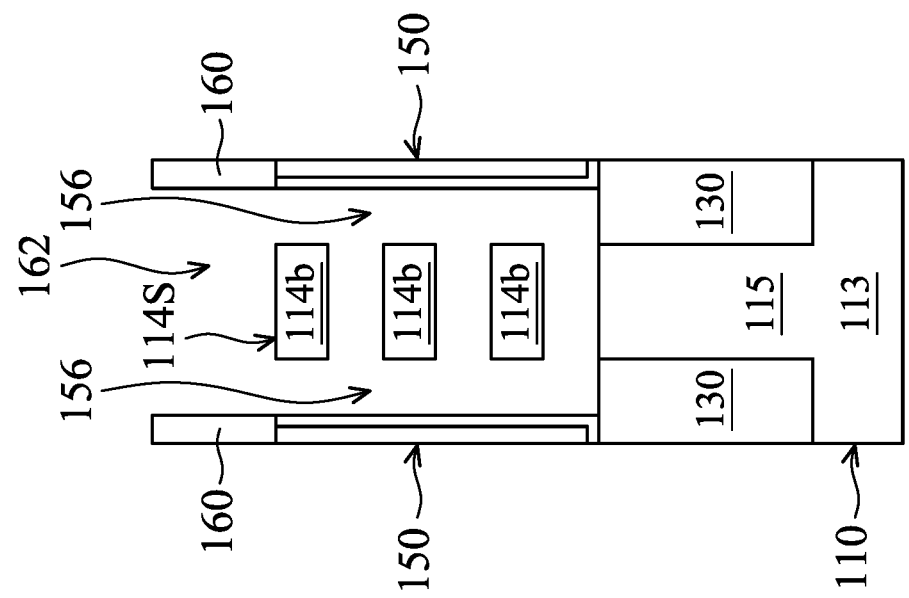
Figures 1, 2B:
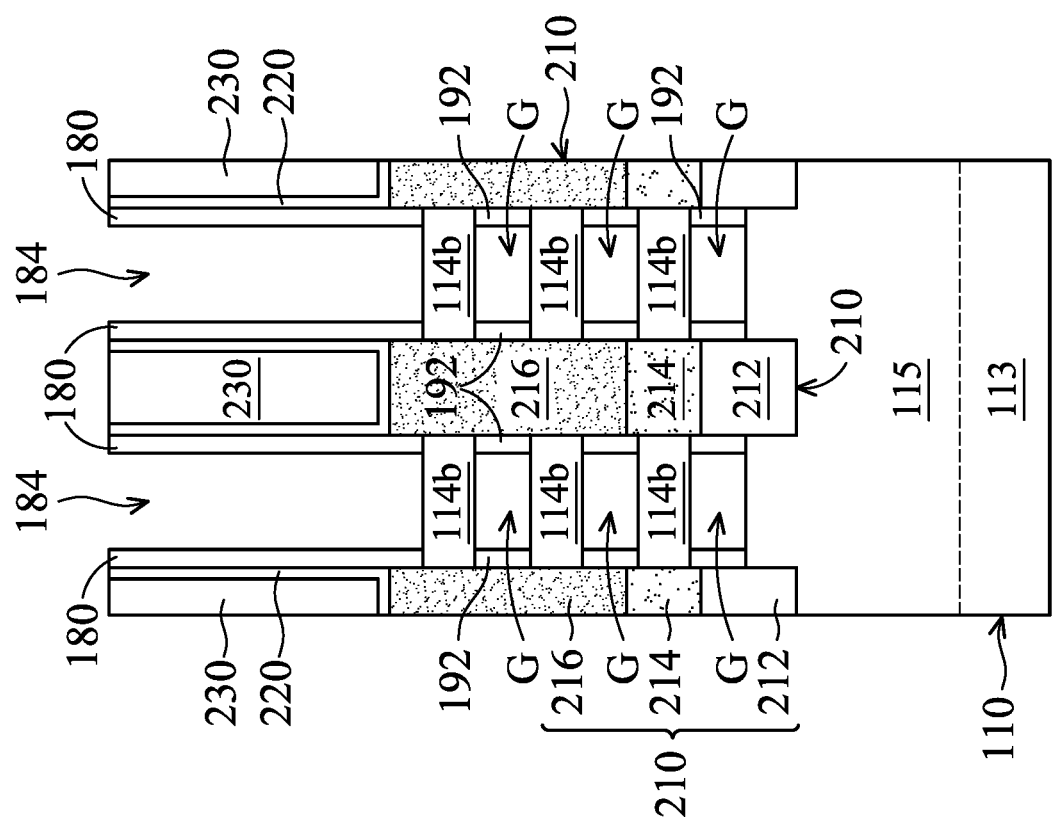
Figures 2, 2C:
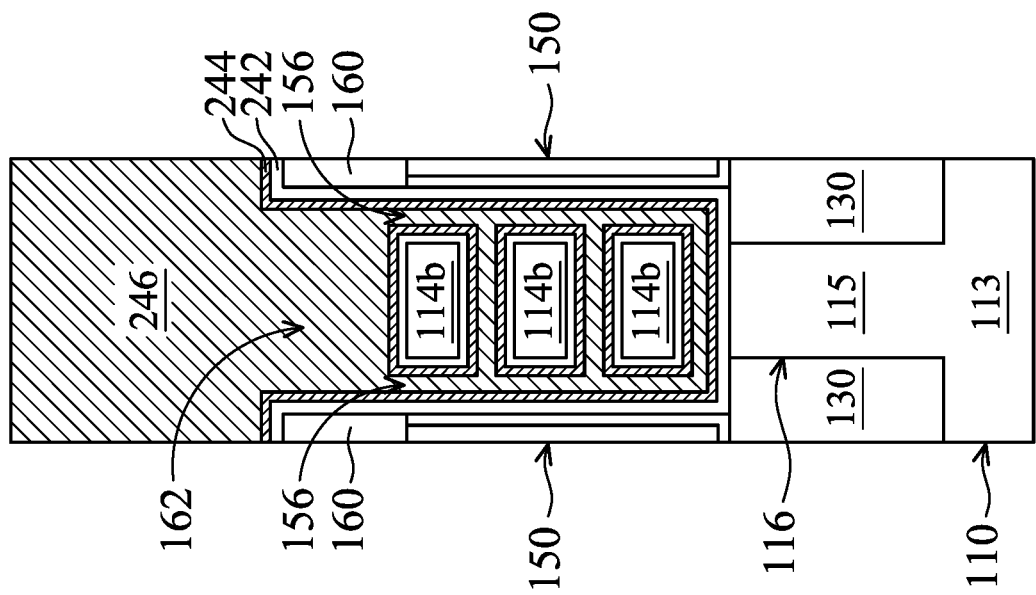
Figures 1, 2C:
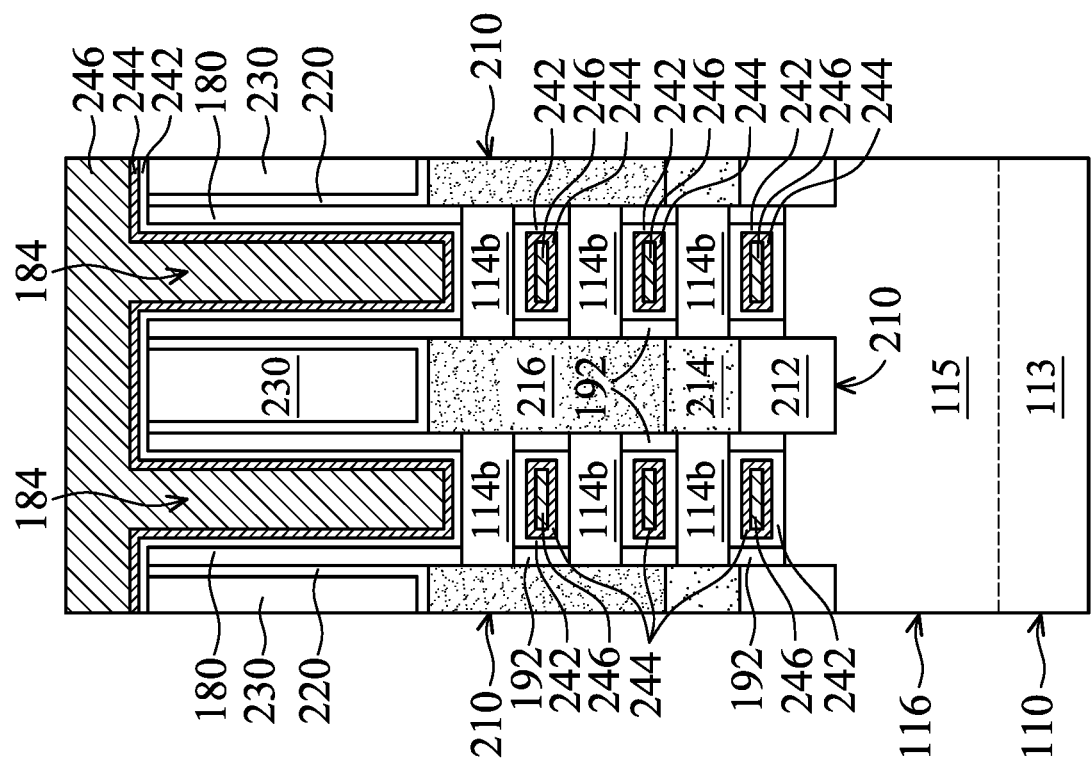
Figures 2, 2D:
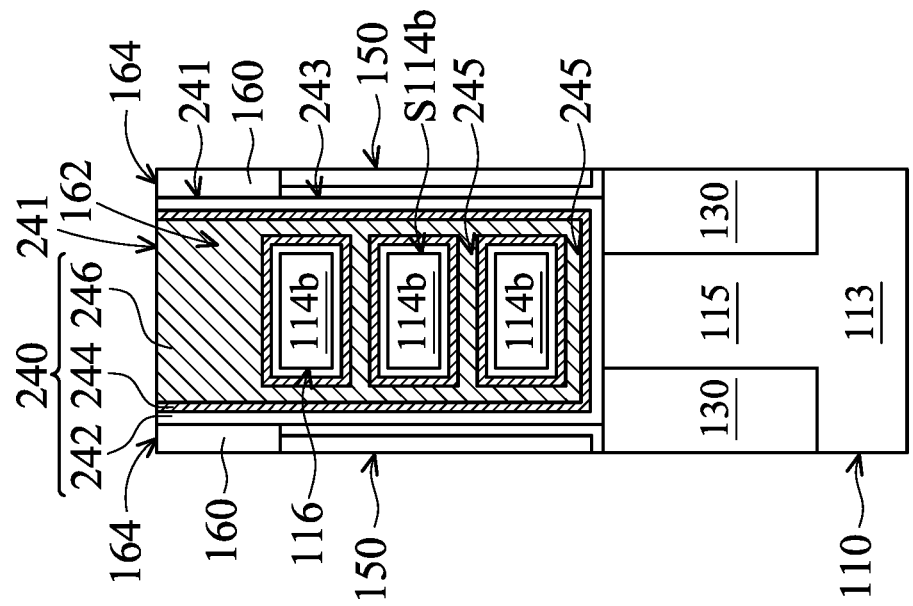
Figures 1, 2D:
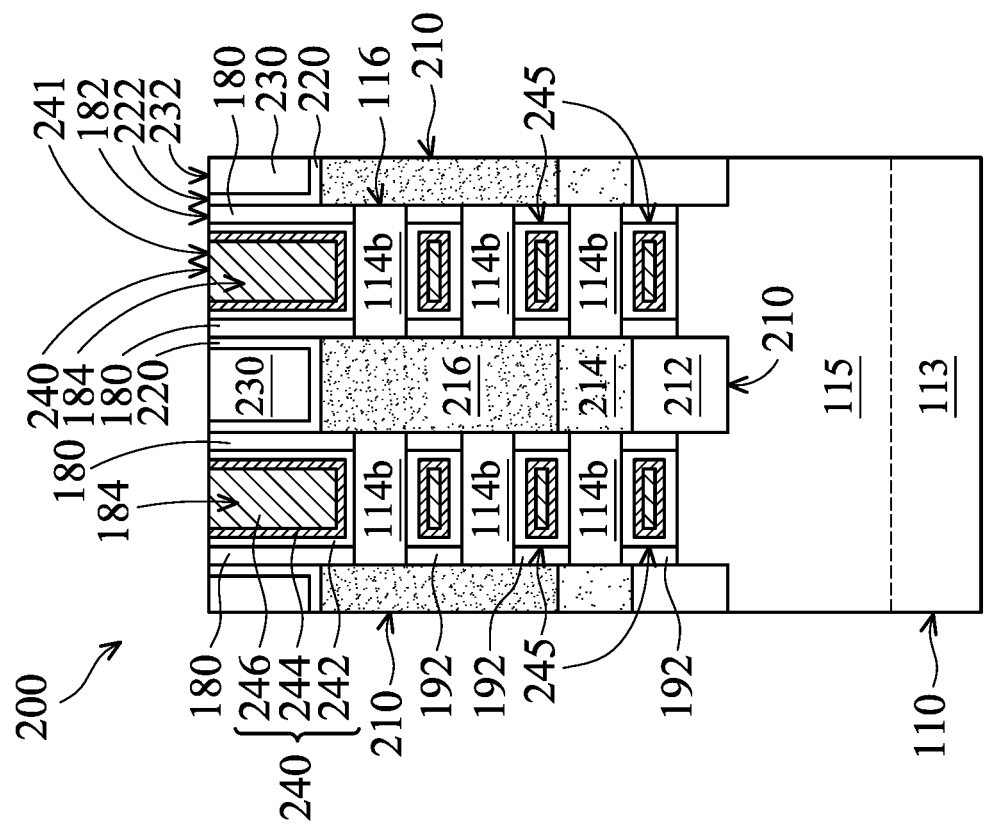

FIGS. 2A-1 to 2D-1 are cross-sectional views of various stages of a process for forming a semiconductor device structure, in accordance with some embodiments. FIGS. 2A-2 to 2D-2 are cross-sectional views of various stages of a process for forming a semiconductor device structure, in accordance with some embodiments.

As shown in FIGS. 2B-1 and 2B-2, the gate stacks 170 are removed to form trenches 184 in the spacer 180 and trench 162 between the dielectric fins 160, in accordance with some embodiments. The removal process includes an etching process, such as a wet etching process or a dry etching process, in accordance with some embodiments.

As shown in FIGS. 2B-1 and 2B-2, the sacrificial nanostructures 114a and the cladding layer 140 are removed through the trenches 184 in the spacer 180 and the trench 162 between the dielectric fins 160, in accordance with some embodiments. As shown in FIG. 2B-1, gaps G between the lower portion 115 and the channel nanostructure 114b and between the channel nanostructures 114b are formed after removing the sacrificial nanostructures 114a, in accordance with some embodiments.

As shown in FIG. 2B-2, through holes 156 are formed in the isolation structure 150 after removing the cladding layer 140, in accordance with some embodiments. The through holes 156 expose the isolation structure 130 thereunder, in accordance with some embodiments. The removal process includes an etching process, such as a wet etching process or a dry etching process, in accordance with some embodiments.

As shown in FIGS. 2C-1 and 2C-2, a gate dielectric layer 242 is conformally formed over the channel nanostructures 114b and the lower portion 115 of the fin structure 116 exposed by the trenches 184 in the spacer 180 and the trench 162 between the dielectric fins 160, in accordance with some embodiments.

The gate dielectric layer 242 is further conformally formed over the inner spacers 192, the spacer 180, the etch stop layer 220, the dielectric layer 230, the dielectric fins 160, the isolation structure 150, the isolation structure 130, and the lower portion 115 of the fin structure 116, in accordance with some embodiments.

The gate dielectric layer 242 is made of a dielectric material such as an oxide material (e.g., silicon oxide) or a high-K material, such as $HfO_2$, $ZrO_2$, $HfZrO_2$, or $Al_2O_3$, in accordance with some embodiments. The gate dielectric layer 242 is formed using a deposition process, such as a chemical vapor deposition process or a physical vapor deposition process, or another suitable process, in accordance with some embodiments.

As shown in FIGS. 2C-1 and 2C-2, a work function metal layer 244 is conformally formed over the gate dielectric layer 242 and in the trenches 184 and 162, in accordance with some embodiments. The work function metal layer 244 is made of titanium-containing material (e.g., TiN or TiSiN) or tantalum-containing material (e.g., TaN), or another suitable conductive material. The work function metal layer 244 is formed using an atomic layer deposition process, a chemical vapor deposition process, a physical vapor deposition process, or another suitable process.

As shown in FIGS. 2C-1 and 2C-2, a gate electrode layer 246 is formed over the work function metal layer 244, in accordance with some embodiments. The gate electrode layer 246 is made of W, Co, Al, or another suitable conductive material. The gate electrode layer 246 is formed using a physical vapor deposition process, an atomic layer deposition process, or another suitable process.

Figure 3A:
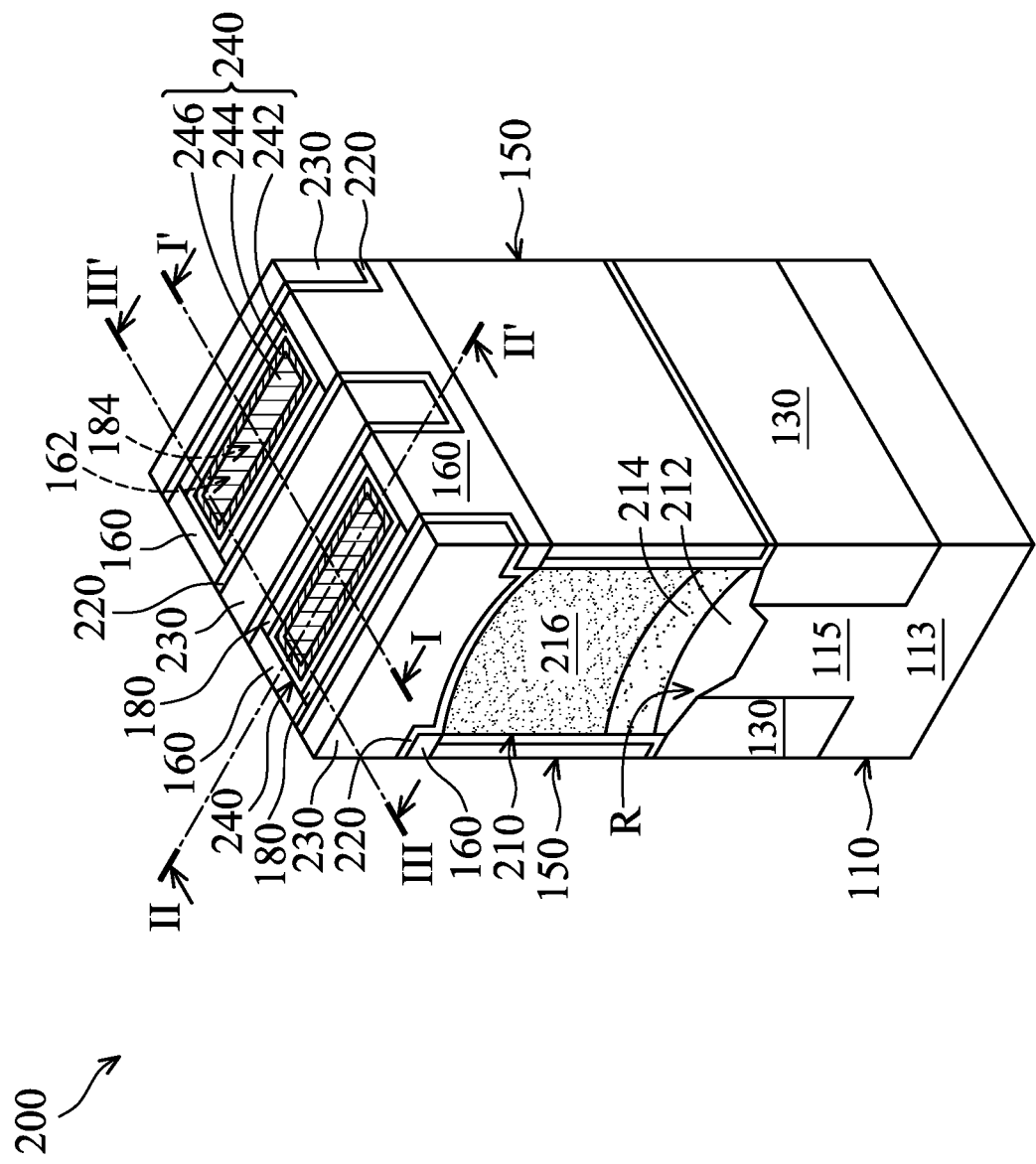
FIG. 3A is a perspective view of the semiconductor device structure of FIG. 2D-1, in accordance with some embodiments.

FIG. 3A is a perspective view of the semiconductor device structure of FIG. 2D-1, in accordance with some embodiments. FIG. 2D-1 is a cross-sectional view illustrating the semiconductor device structure along a sectional line I-I' in FIG. 3A, in accordance with some embodiments. FIG. 2D-2 is a cross-sectional view illustrating the semiconductor device structure along a sectional line II-II' in FIG. 3A, in accordance with some embodiments.

As shown in FIGS. 2D-1, 2D-2, and 3A, portions of the gate dielectric layer 242, the work function metal layer 244, and the gate electrode layer 246 outside of the trenches 184 and 162 and top portions of the spacer 180, the etch stop layer 220, and the dielectric layer 230 are removed, in accordance with some embodiments.

After the removal process, in one of the trenches 184 and 162, the remaining gate dielectric layer 242, the remaining work function metal layer 244, and the remaining gate electrode layer 246 together form a gate stack 240, in accordance with some embodiments. The gate stack 240 is wrapped around the channel nanostructures 114b, in accordance with some embodiments. In some embodiments, a portion of the gate stack 240 is between the channel nanostructure 114b and the lower portion 115.

The removal process includes a planarization process such as a chemical mechanical polishing process, in accordance with some embodiments. Therefore, after the removal process, the top surfaces 241, 182, 222, 232, and 164 of the gate stack 240, the spacer 180, the etch stop layer 220, the dielectric layer 230, and the dielectric fins 160 are substantially level with each other, in accordance with some embodiments.

As shown in FIG. 2D-2, each gate stack 240 has an upper portion 241, sidewall portions 243, and lower portions 245, in accordance with some embodiments. The upper portion 241 is over the channel nanostructures 114b, in accordance with some embodiments. The lower portions 245 are between the channel nanostructures 114b and between the channel nanostructure 114b and the lower portion 115, in accordance with some embodiments.

As shown in FIG. 2D-2, the sidewall portions 243 are over sidewalls S114b of the channel nanostructures 114b, in accordance with some embodiments. As shown in FIG. 2D-2, the lower portion 245 is wider than the sidewall portion 243, in accordance with some embodiments.

In some embodiments, the lower portion 245 of the gate stack 240 is thinner than the channel nanostructure 114b. In some embodiments, the lower portion 245 of the gate stack 240 and the channel nanostructure 114b have the same thickness. In some embodiments, the lower portion 245 of the gate stack 240 is thicker than the channel nanostructure 114b.

As shown in FIGS. 2D-1 and 2D-2, the inner spacers 192 are under the channel nanostructures 114b and between the lower portion 245 of the gate stack 240 and the source/drain structures 210, in accordance with some embodiments. The inner spacer 192 separates the source/drain structures 210 from the lower portions 245 of the gate stack 240, in accordance with some embodiments.

As shown in FIG. 2D-1, the inner spacers 192 separate the source/drain structures 210 from the gate stack 240, in accordance with some embodiments.

Figure 3B:
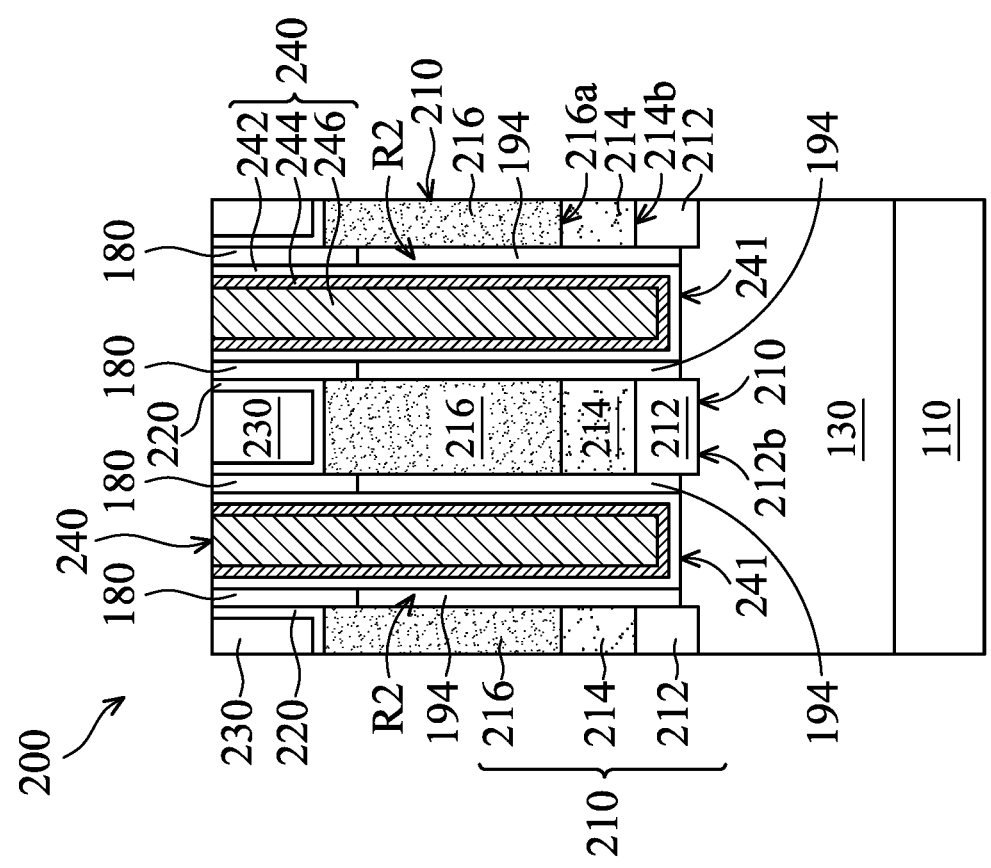
FIG. 3B is a cross-sectional view illustrating the semiconductor device structure along a sectional line III-III' in FIG. 3A, in accordance with some embodiments.

FIG. 3B is a cross-sectional view illustrating the semiconductor device structure along a sectional line III-III' in FIG. 3A, in accordance with some embodiments. As shown in FIG. 3B, a bottom surface 216a of the doped layer 216 is higher than a bottom surface 241 of the gate stack 240, in accordance with some embodiments.

In some embodiments, a bottom surface 214b of the doped layer 214 is higher than the bottom surface 241 of the gate stack 240. In some embodiments, a bottom surface 212b of the undoped semiconductor layer 212 is lower than the bottom surface 241 of the gate stack 240.

Figure 4:
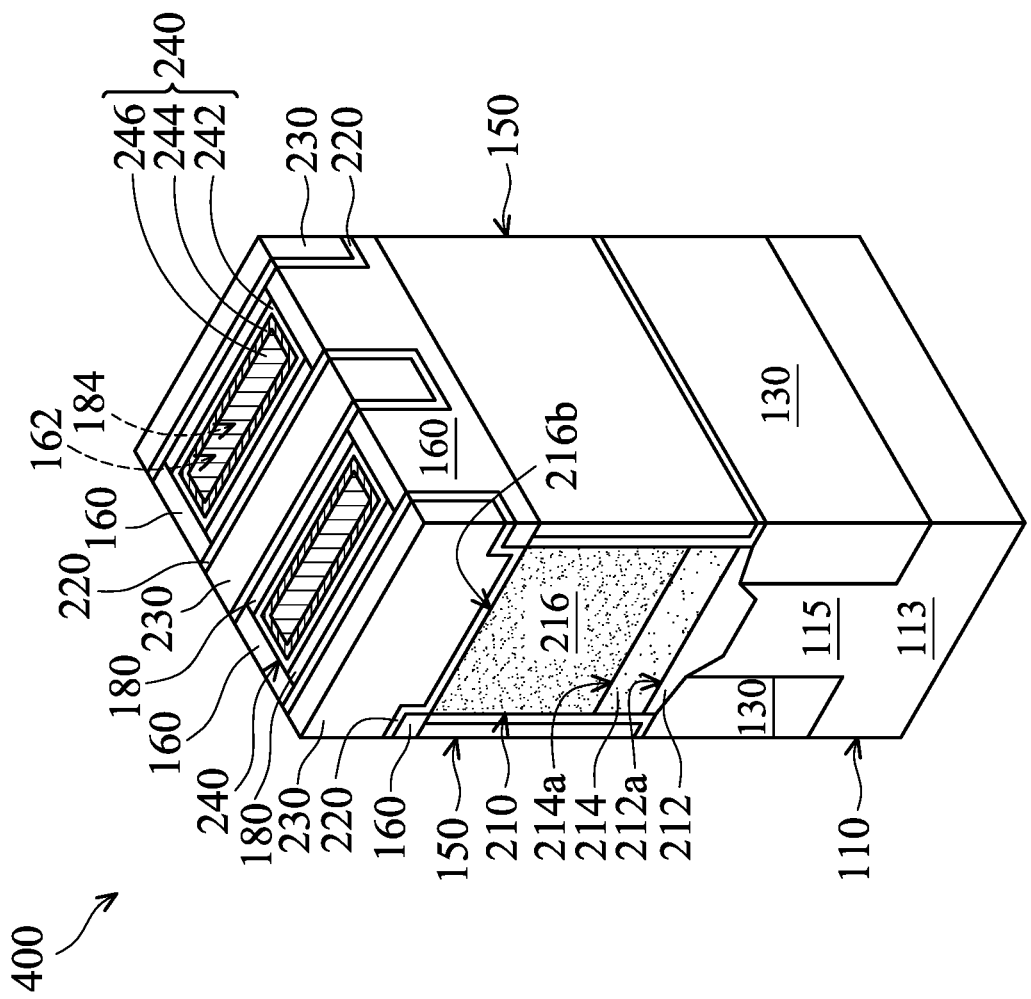
FIG. 4 is a perspective view of a semiconductor device structure, in accordance with some embodiments.

FIG. 4 is a perspective view of a semiconductor device structure 400, in accordance with some embodiments. As shown in FIG. 4, the semiconductor device structure 400 is similar to the semiconductor device structure 200 of FIG. 3A, except that the top surface 212a of the undoped semiconductor layer 212 is a planar surface, in accordance with some embodiments. The top surface 214a of the doped layer 214 is a planar surface, in accordance with some embodiments. The top surface 216b of the doped layer 216 is a planar surface, in accordance with some embodiments.

Figure 5:
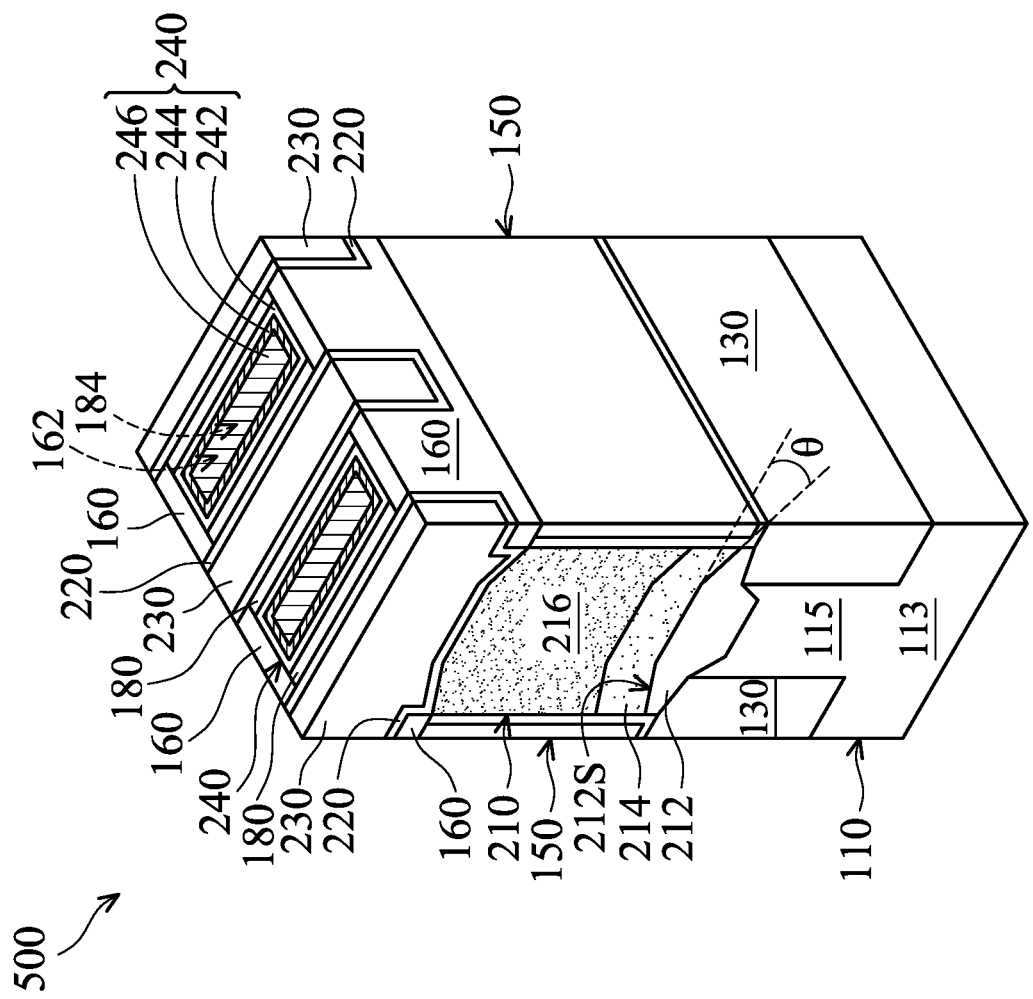
FIG. 5 is a perspective view of a semiconductor device structure, in accordance with some embodiments.

FIG. 5 is a perspective view of a semiconductor device structure 500, in accordance with some embodiments. As shown in FIG. 5, the semiconductor device structure 500 is similar to the semiconductor device structure 200 of FIG. 3A, except that the undoped semiconductor layer 212 has a substantially hexagonal shape, in accordance with some embodiments.

The undoped semiconductor layer 212 has inclined surfaces 212S, in accordance with some embodiments. The inclined surface 212S is at a slope (i.e., at an angle θ to a horizontal surface) ranging from about 30° to about 80°, in accordance with some embodiments.

Processes and materials for forming the semiconductor device structures 400 and 500 may be similar to, or the same as, those for forming the semiconductor device structure 200 described above. Elements designated by the same reference numbers as those in FIGS. 1A to 5 have structures and materials that are the same or similar. Therefore, the detailed descriptions thereof will not be repeated herein.

In accordance with some embodiments, semiconductor device structures and methods for forming the same are provided. The method includes sequentially forming an undoped semiconductor layer and a doped layer over a lower portion of a fin structure and an isolation structure. The undoped semiconductor layer separates the doped layer from the isolation structure, which prevents the dopants in the doped layer from diffusing into the isolation structure. Therefore, the short circuit between source/drain structures is prevented. As a result, the reliability of the semiconductor device structure with the undoped semiconductor layer is improved.

In accordance with some embodiments, a semiconductor device structure is provided. The semiconductor device structure includes a substrate having a base and a fin structure over the base. The semiconductor device structure includes an isolation structure over the base and surrounding a lower portion of the fin structure. The semiconductor device structure includes a gate stack wrapped around an upper portion of the fin structure. The semiconductor device structure includes a source/drain structure partially embedded in the isolation structure and the lower portion of the fin structure. The source/drain structure has an undoped semiconductor layer and a first doped layer over the undoped semiconductor layer, and the undoped semiconductor layer separates the first doped layer from the isolation structure.

In accordance with some embodiments, a semiconductor device structure is provided. The semiconductor device structure includes a substrate having a base and a fin structure over the base. The semiconductor device structure includes an isolation structure over the base and surrounding a lower portion of the fin structure. The semiconductor device structure includes a gate stack wrapped around an upper portion of the fin structure. The semiconductor device structure includes a source/drain structure partially embedded in the isolation structure and the lower portion of the fin structure. The source/drain structure has an undoped semiconductor layer and a first doped layer, the first doped layer is over the undoped semiconductor layer, and a first bottom surface of the first doped layer is higher than a second bottom surface of the gate stack.

In accordance with some embodiments, a method for forming a semiconductor device structure is provided. The method includes providing a substrate having a base and a fin structure over the base. The method includes forming an isolation structure over the base. The isolation structure surrounds a lower portion of the fin structure. The method includes forming a gate stack over the fin structure and the isolation structure. The method includes removing portions of the fin structure and the isolation structure, which are not covered by the gate stack. The removing of the portions of the fin structure and the isolation structure forms a recess in the lower portion of the fin structure and the isolation structure. The method includes forming an undoped semiconductor layer in the recess. The recess is filled up with the undoped semiconductor layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure,
    comprising:
    providing a substrate having a base and a fin structure over the base, wherein the fin structure comprises a lower portion, a first nanostructure, and a second nanostructure, and the first nanostructure is between the lower portion and the second nanostructure;
    forming an isolation structure over the base, wherein the isolation structure surrounds the lower portion;
    forming a gate stack over the fin structure and the isolation structure;
    removing portions of the fin structure and the isolation structure, which are not covered by the gate stack, wherein the removing of the portions of the fin structure and the isolation structure forms a recess in the lower portion and the isolation structure; and
    forming an undoped semiconductor layer in the recess, wherein the recess is filled up with the undoped semiconductor layer, and a first topmost portion of the undoped semiconductor layer is lower than a first bottom surface of the first nanostructure.

2. The method for forming the semiconductor device structure as claimed in claim 1, further comprising:
    forming a first doped layer over the undoped semiconductor layer, wherein the undoped semiconductor layer separates the first doped layer from the isolation structure and the lower portion.

3. The method for forming the semiconductor device structure as claimed in claim 2, further comprising:
    forming a second doped layer over the undoped semiconductor layer, wherein the first doped layer is formed over the second doped layer, and a first dopant concentration of the first doped layer is greater than a second dopant concentration of the second doped layer.

4. The method for forming the semiconductor device structure as claimed in claim 3, wherein the second nanostructure is spaced apart from the gate stack, a second topmost portion of the second doped layer is between a top surface of the first nanostructure and a second bottom surface of the second nanostructure.

5. The method for forming the semiconductor device structure as claimed in claim 2, further comprising:
    forming a cladding layer over the isolation structure and a sidewall of the fin structure, wherein the gate stack is further formed over the cladding layer, and a second bottom surface of the first doped layer is higher than a third bottom surface of the cladding layer.

6. The method for forming the semiconductor device structure as claimed in claim 5, further comprising:
    forming a second doped layer over the undoped semiconductor layer, wherein the first doped layer is formed over the second doped layer, and a fourth bottom surface of the second doped layer is higher than the third bottom surface of the cladding layer.

7. The method for forming the semiconductor device structure as claimed in claim 2, wherein a first conductivity of the first doped layer is greater than a second conductivity of the undoped semiconductor layer.

8. The method for forming the semiconductor device structure as claimed in claim 7, further comprising:
    forming a second doped layer over the undoped semiconductor layer, wherein the first doped layer is formed over the second doped layer, and the first conductivity of the first doped layer is greater than a third conductivity of the second doped layer.

9. The method for forming the semiconductor device structure as claimed in claim 8, wherein the third conductivity of the second doped layer is greater than the second conductivity of the undoped semiconductor layer.

10. The method for forming the semiconductor device structure as claimed in claim 1, wherein an entire top surface of the undoped semiconductor layer is over a top surface of the isolation structure.

11. The method for forming the semiconductor device structure as claimed in claim 10, wherein the entire top surface of the undoped semiconductor layer is a convex curved top surface.

12. A method for forming a semiconductor device structure,
    comprising:
    providing a substrate having a base and a fin structure over the base, wherein the fin structure comprises a lower portion and a nanostructure over the lower portion;
    forming an isolation structure over the base, wherein the isolation structure surrounds the lower portion;
    forming a gate stack over the fin structure and the isolation structure;
    removing portions of the fin structure and the isolation structure, which are not covered by the gate stack, to form a recess in the fin structure and the isolation structure; forming an undoped semiconductor layer in the recess, wherein a first bottom surface of the undoped semiconductor layer is lower than a second bottom surface of the gate stack; and
    forming a doped layer over the undoped semiconductor layer, wherein the undoped semiconductor layer separates the doped layer from the isolation structure and the lower portion, and the doped layer is in direct contact with the nanostructure.

13. The method for forming the semiconductor device structure as claimed in claim 12, wherein the doped layer is thicker than the undoped semiconductor layer.

14. The method for forming the semiconductor device structure as claimed in claim 13, wherein the undoped semiconductor layer and the doped layer have a substantially same width.

15. The method for forming the semiconductor device structure as claimed in claim 12, wherein the undoped semiconductor layer has a trapezoidal shape.

16. A method for forming a semiconductor device structure, comprising:
  providing a substrate having a base and a fin structure over the base, wherein the fin structure comprises a lower portion, a first nanostructure, and a second nanostructure, and the first nanostructure is between the lower portion and the second nanostructure;
  forming an isolation structure over the base, wherein the isolation structure surrounds the lower portion;
  forming a gate stack over the fin structure and the isolation structure;
  removing portions of the fin structure and the isolation structure, which are not covered by the gate stack, to form a recess in the fin structure and the isolation structure;
  forming an undoped semiconductor layer in the recess;
  forming a first doped layer over the undoped semiconductor layer, wherein the first doped layer is in direct contact with the first nanostructure; and
  forming a second doped layer over the first doped layer, wherein the undoped semiconductor layer is thicker than the first doped layer and thinner than the second doped layer.

17. The method for forming the semiconductor device structure as claimed in claim 16, wherein a first sidewall of the first doped layer is coplanar with a second sidewall of the undoped semiconductor layer and a third sidewall of the second doped layer.

18. The method for forming the semiconductor device structure as claimed in claim 16, wherein the undoped semiconductor layer is partially embedded in the first doped layer.

19. The method for forming the semiconductor device structure as claimed in claim 16, wherein the second doped layer is in direct contact with the second nanostructure.

20. The method for forming the semiconductor device structure as claimed in claim 19, wherein the first doped layer is spaced apart from the second nanostructure, and the second doped layer is spaced apart from the first nanostructure.

* * * * *